(12) United States Patent
Ausserlechner et al.

(10) Patent No.: US 8,076,927 B2
(45) Date of Patent: Dec. 13, 2011

(54) MAGNETIC-FIELD SENSOR AND METHOD OF CALIBRATING A MAGNETIC-FIELD SENSOR

(75) Inventors: Udo Ausserlechner, Villach (AT); Dirk Hammerschmidt, Villach (AT)

(73) Assignee: Infineon Technologies AG, Neubiberg (DE)

(*) Notice: Subject to any disclaimer, the term of this patent is extended or adjusted under 35 U.S.C. 154(b) by 589 days.

(21) Appl. No.: 12/163,589

(22) Filed: Jun. 27, 2008

(65) Prior Publication Data

US 2009/0001965 A1    Jan. 1, 2009

(30) Foreign Application Priority Data

Jun. 28, 2007  (DE) .......................... 10 2007 029 817

(51) Int. Cl.
*H01L 43/06* (2006.01)
*G01B 7/14* (2006.01)
*G01R 33/09* (2006.01)
(52) U.S. Cl. ................................. 324/207.21; 324/252
(58) Field of Classification Search ............... 324/207.2, 324/207.21, 207.24, 207.25, 251, 252, 202; 338/32 R, 32 H; 702/189; 327/510, 511; 257/421

See application file for complete search history.

(56) References Cited

U.S. PATENT DOCUMENTS

| 6,486,657 | B2* | 11/2002 | Schroeder | 324/207.21 |
| 7,119,533 | B2 | 10/2006 | Tamura et al. | |
| 7,355,389 | B2* | 4/2008 | Rieger et al. | 324/207.24 |
| 2001/0003422 | A1* | 6/2001 | Andermo et al. | 324/207.17 |
| 2003/0107373 | A1 | 6/2003 | Van Zon | |
| 2008/0186019 | A1* | 8/2008 | Hinz | 324/207.21 |
| 2009/0102465 | A1* | 4/2009 | Jansen et al. | 324/207.21 |

FOREIGN PATENT DOCUMENTS

| DE | 256 628 A3 | 5/1988 |
| DE | 10 2005 052 261 A1 | 5/2007 |

* cited by examiner

*Primary Examiner* — Kenneth J Whittington
(74) *Attorney, Agent, or Firm* — Slater & Matsil, L.L.P.

(57) ABSTRACT

An embodiment of a magnetic-field sensor has a plurality of sensor elements connected to form measurement arrangements, each measurement arrangement having a measurement tap, and a control circuit formed to perform an embodiment of a method of calibrating the magnetic-field sensor.

28 Claims, 21 Drawing Sheets

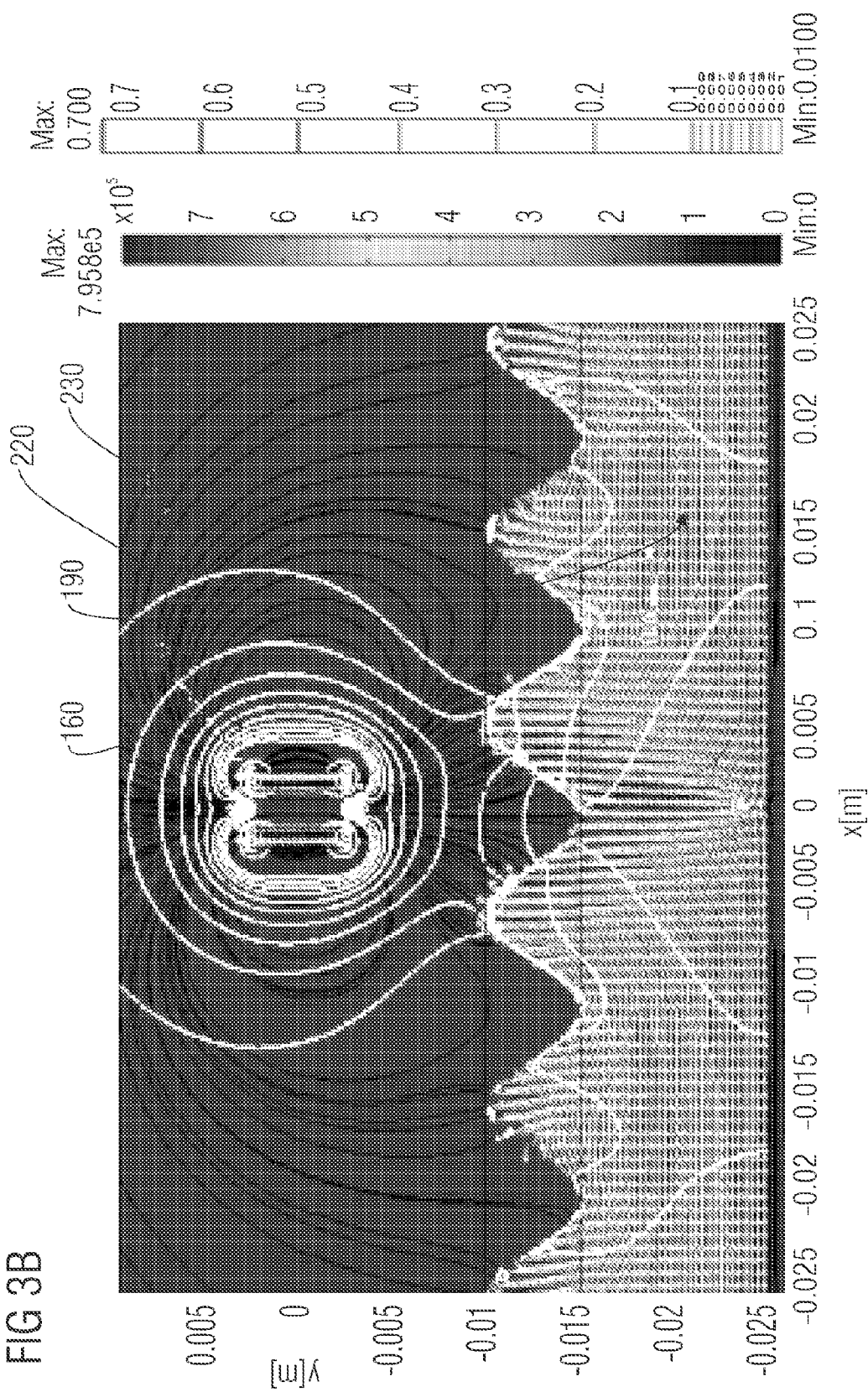

MAGNETIC-FIELD SENSOR AND METHOD OF CALIBRATING A MAGNETIC-FIELD SENSOR

This application claims priority from German Patent Application No. 10 2007 029 817.1, which was filed on Jun. 28, 2007, and is incorporated herein by reference.

BACKGROUND

Embodiments of the present invention relate to magnetic-field sensors and methods of calibrating magnetic-field sensors, such as may be employed in many areas of technology, such as for determining an angle, a rotational speed, a direction of a magnetic field or other magnetic-field-related quantities.

Magnetic-field sensors may be employed in many areas of technology in which for example a determination of a rotation rate, a rotation angle or other information contained in a magnetic field should be extracted or acquired. Thus, magnetic-field sensors may be employed for determining a rotational speed and, if required, for determining a rotation direction of shafts and other rotating objects, for example, by having the rotation of the respective object accompanied by a periodic modulation of a magnetic field, for example, caused by an indicator object mechanically coupled to the rotating object, for example. Here, the indicator object may itself generate the magnetic field to be detected by the magnetic-field sensor or also modulate or influence a magnetic field caused by a magnet correspondingly.

In many fields of application and concrete implementations of magnetic-field sensors, it is desired here to be able to perform a most accurate measurement possible, wherein at the same time, however, sufficient reliability in operation and/or reliability in fabrication should be obtainable.

SUMMARY OF THE INVENTION

An embodiment of a method of calibrating a magnetic-field sensor comprising a plurality of sensor elements connected to form measurement arrangements, each measurement arrangement comprising a measurement tap, comprises supplying the measurement arrangement with an excitation signal to generate a tappable measuring signal at each measurement tap of the measurement arrangements, detecting the measuring signals, evaluating the detected measuring signals by comparing the detected measuring signals with a comparison value, and determining the measurement arrangement with the smallest difference, in terms of magnitude, from the comparison value.

Another embodiment of a method of calibrating a magnetic-field sensor comprising a plurality of sensor elements connected to form measurement arrangements, each measurement arrangement comprising a measurement tap, and wherein the magnetic-field sensor is exposed to a magnetic field periodically changing at least in portions, comprises supplying the measurement arrangements with an excitation signal, to generate a tappable measuring signal at each measurement tap of the measurement arrangement, detecting the measuring signals of at least two measurement arrangements over at least one period of the magnetic field, evaluating the detected measuring signals by determining the respective maximum and minimum measuring values of the detected measuring signals, and determining the measurement arrangement with the greatest difference of the respective maximum and minimum measuring values.

An embodiment of a method of calibrating a magnetic-field sensor comprising a plurality of sensor elements connected to form measurement arrangements, each measurement arrangement comprising a measurement tap, wherein the magnetic-field sensor is exposed to a magnetic field periodically changing at least in portions, comprises determining a measurement arrangement as a present measurement arrangement, determining a further measurement arrangement as a comparison measurement arrangement, which is not the present measurement arrangement, supplying the present measurement arrangement and the comparison measurement arrangement with an excitation signal, to generate a tappable measuring signal at the measurement arrangement of the present measurement arrangement and the comparison measurement arrangement, detecting measuring signals of the present measurement arrangement, providing an output signal on the basis of the detected measuring signal of the present measurement arrangement, evaluating the detected measuring signals of the present measurement arrangement by determining a minimum measuring value and a maximum measuring value of the present measurement arrangement, detecting a first measuring value of the comparison measurement arrangement if a detected measuring signal of the present measurement arrangement corresponds to the maximum measuring value of the present measurement arrangement, detecting a second measuring signal of the comparison measurement arrangement if a detected measuring signal of the present measurement arrangement corresponds to the minimum measuring value of the present measurement arrangement, and determining the comparison measurement arrangement as the present measurement arrangement if a difference of the first measuring signal and the second measuring signal is greater than a difference of the maximum and the minimum measuring value of the present measurement arrangement.

An embodiment of a method of calibrating a magnetic-field sensor comprising a plurality of sensor elements connected to form a measurement arrangement, each measurement arrangement comprising a measurement tap, and wherein the magnetic-field sensor is exposed to a magnetic field periodically changing at least in portions, comprises determining a measurement arrangement sequence including at least one measurement arrangement, supplying the measurement arrangements of the measurement arrangement sequence with an excitation signal, to generate a tappable measuring signal at the center taps of the measurement arrangements of the measurement arrangement sequence, detecting measuring signals of the measurement arrangements of the measurement arrangement sequence, providing an output signal on the basis of the detected measuring signals of the measurement arrangements of the measurement arrangement sequence, evaluating the individual measuring signals of the measurement arrangement sequence by comparing the individual measuring signals and the output signal on the basis of a comparison relationship, and modifying the measurement arrangement sequence if evaluating a measuring signal of a measurement arrangement on the basis of the comparison relationship does not satisfy a comparison condition.

An embodiment of a magnetic-field sensor includes a plurality of sensor elements connected to form measurement arrangements, each measurement arrangement comprising a measurement tap, and a control circuit coupled to the measurement taps of the measurement arrangements and formed to perform an embodiment of a method of calibrating a magnetic-field sensor.

An embodiment of a magnetic-field sensor includes a plurality of magnetoresistive sensor elements connected to form measurement arrangements, each measurement arrangement comprising a measurement tap, and a control circuit coupled to the measurement taps of the measurement arrangements and further including a memory into which information regarding a measurement arrangement can be written once and from which the same can be read out multiple times, wherein the control circuit is formed to store, in the memory, information regarding a measurement arrangement determined for measurement operation.

BRIEF DESCRIPTION OF THE DRAWINGS

Embodiments of the present invention will be detailed subsequently referring to the appended drawings, in which:

FIGS. 3a and 3b show illustrations of numeric simulations of field lines and flux densities of a magnet in the interplay with an indicator object;

DETAILED DESCRIPTION OF ILLUSTRATIVE EMBODIMENTS

FIGS. 1 to 16 show various block circuit diagrams, illustrations and flow charts of embodiments of magnetic-field sensors and embodiments of methods of calibrating a magnetic-field sensor, as well as further explanatory illustrations. Before describing further embodiments of magnetic-field sensors, methods of calibrating a magnetic-field sensor and applications in connection with FIGS. 2 to 16, a first embodiment of a magnetic-field sensor will be described at first in connection with FIG. 1.

Figure 1:
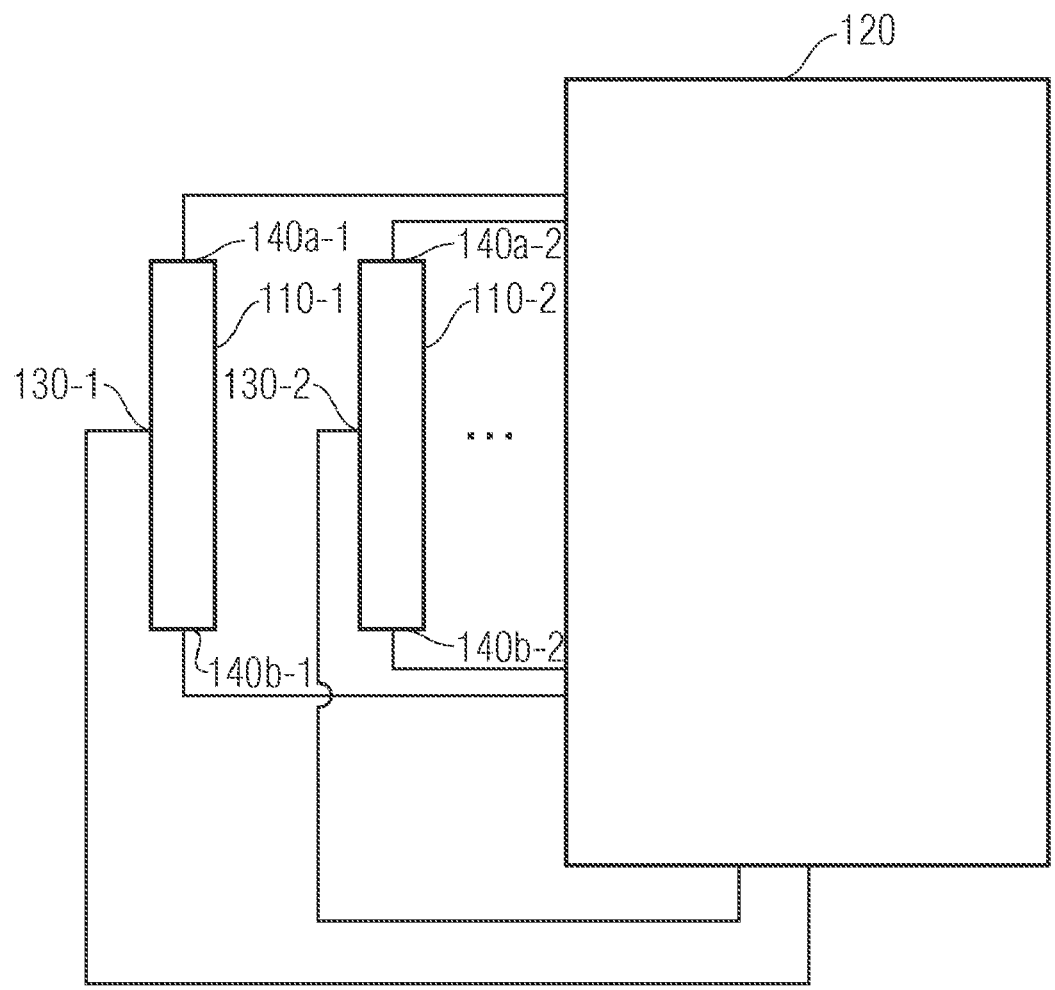
FIG. 1 shows a block circuit diagram of an embodiment of a magnetic-field sensor.

FIG. 1 shows a first embodiment of a magnetic-field sensor 100 with a plurality of measurement arrangements or measurement configurations 110 and a control circuit 120.

The embodiment of a sensor 100 includes a plurality of sensor elements connected to form measurement arrangements 110, each measurement arrangement 110 having a measurement tap 130, as well as the control circuit 120. Depending on the concrete implementation of an embodiment, the control circuit 120 here may be formed to perform an embodiment of a method of calibrating the magnetic-field sensor 100, which still is to be explained later.

More specifically, the embodiment of the magnetic-field sensor 100, as it is shown in FIG. 1, includes a first measurement arrangement 110-1 and a second measurement arrangement 110-2, each comprising a measurement tap 130-1, 130-2 coupled to the sensor circuit or control circuit 120. Moreover, the measurement arrangements 110 each comprise two further terminals 140a-1, 140a-2 and 140b-1, 140b-2 via which the measurement arrangements 110 also are coupled to the control circuit 120.

Via the terminals 140a and 140b, the control circuit 120 is capable of applying an excitation signal to the measurement arrangements 110, so that a measuring signal, which can be detected via the coupling of the measurement taps 130 to the control circuit or sensor circuit 120 by same, is generated at the measurement taps 130. Depending on the embodiment, the measurement taps 130 may indeed coincide with one of the terminals 140a or 140b.

The control circuit or sensor circuit 120 hence is capable of supplying individual, several or all measurement arrangements 110 with a corresponding excitation signal via the terminals 140a, 140b, and of detecting a measuring signal tappable at the measurement taps 130 due to the excitation signal, and of evaluating and/or processing same further within the framework of embodiments of methods of calibrating the magnetic-field sensor 110, for example.

However, before explaining and discussing more implementation details of different embodiments of magnetic-field sensors 100 in connection with FIGS. 8 to 16, as well as explaining different embodiments of methods of calibrating magnetic-field sensors 100, at first a possible field of application of embodiments of magnetic-field sensors 100 will be explained in connection with FIGS. 2a to 7. In this context, it is to be pointed out that the embodiment of a magnetic-field sensor 100 shown in FIG. 1 is, of course, not limited to only two measurement arrangements 110-1 and 110-2, as it is shown in FIG. 1, but may include any number of measurement arrangements 110, as this is also indicated by the three dots in FIG. 1. In this case, the measurement arrangements concerned are coupled to the control circuit or sensor circuit 120 via the terminals 140a, 140b as well as the measurement taps 130 each, wherein the measurement tap 130 of a measurement arrangement may indeed coincide with one of the two terminals 140a or 140b.

Here, within the framework of the present description, an individual sensor element or a more complex circuit of sensor elements is meant by a measurement arrangement 110. Thus, a measurement arrangement 110 may, for example, include, apart from an individual sensor element, a series connection of a sensor element with a resistive element (e.g., an ohmic resistor or an ohmic resistive element of metal or a semiconducting material, an alloy etc.), a series connection of two sensor elements or a parallel connection of two series connections, wherein at least one series connection includes at least one sensor element in this case. A series connection of an individual sensor element with a further sensor element or a resistive element also is referred to as a half-bridge circuit or a branch of a full-bridge circuit, whereas the parallel connection described before also is referred to as a full-bridge circuit. In summary, the designation "measurement bridges" also is used for full-bridge circuits and half-bridge circuits. More detailed examples will be described more fully in connection with FIG. 10.

As still to be explained in the following, the sensor elements of the individual measurement arrangements (110) here are arranged on a carrier, chip or substrate of the magnetic-field sensor in a manner laterally shifted with respect to each other or laterally offset with respect to each other, so that different measurement points spatially separated from each other each result for the various measurement configurations. Depending on the selection of a measurement arrangement 110, the respective active measurement point of the magnetic-field sensor may thus be shifted based on the lateral arrangement of the sensor elements on the chip.

Moreover, it is obvious here to point out that a first component coupled to a second component means two such components directly connected to each other or being in contact or connected to each other via a further component or circuit, within the framework of the present patent application. In other words, two components electrically coupled to each other mean such components directly connected to each other in electrically conductive manner or in electrical contact with each other via a further component, within the framework of the present patent application. Thus, the measurement arrangements 110, with respect to their terminals 140a, 140b, may, for example, be coupled or, in this case, connected to the sensor circuit 120 via direct metal connection lines or connection structures. Likewise, the measurement arrangements 110 and/or their terminals 140a, 140b may, however, also be coupled to the control circuit 120 via further circuits, such as fuses, protective circuits for protection from electrostatic discharges, resistors or other circuits.

Moreover, it also is to be pointed out here that, within the framework of the present patent application, summarizing reference numerals are used for structures, sensor elements, circuits and other objects if the objects concerned occur multiple times within the framework of an embodiment, or also similar objects and structures occur or are implemented in several embodiments, for example. Here, in general, the respective summarizing reference numerals are used, unless a certain object or a certain functional feature, a property or another feature of a certain object is discussed or explained. Hence, for example, the reference numeral 110 in the context of the embodiment shown in FIG. 1 as well as in the context of other embodiments of a magnetic-field sensor 100 describes a(n) (arbitrary) measurement arrangement of the embodiment concerned, while the reference numeral (110-1), for example, designates the first measurement arrangement of the embodiment shown in FIG. 1 or another embodiment. Here, passages of the description relating to an object concerned may also be transferred to descriptions of other embodiments, unless explicitly indicated otherwise. Thus, for example within the framework of the measurement arrangements 110 of the embodiment of the magnetic-field sensor 100 from FIG. 1, measurement arrangements 110 as explained and described in greater detail within the framework of FIG. 10, for example, may be implemented or employed. Hence, the use of summarizing reference numerals allows for a significantly more compact and clear description of embodiments of the present invention.

Figure 2A:
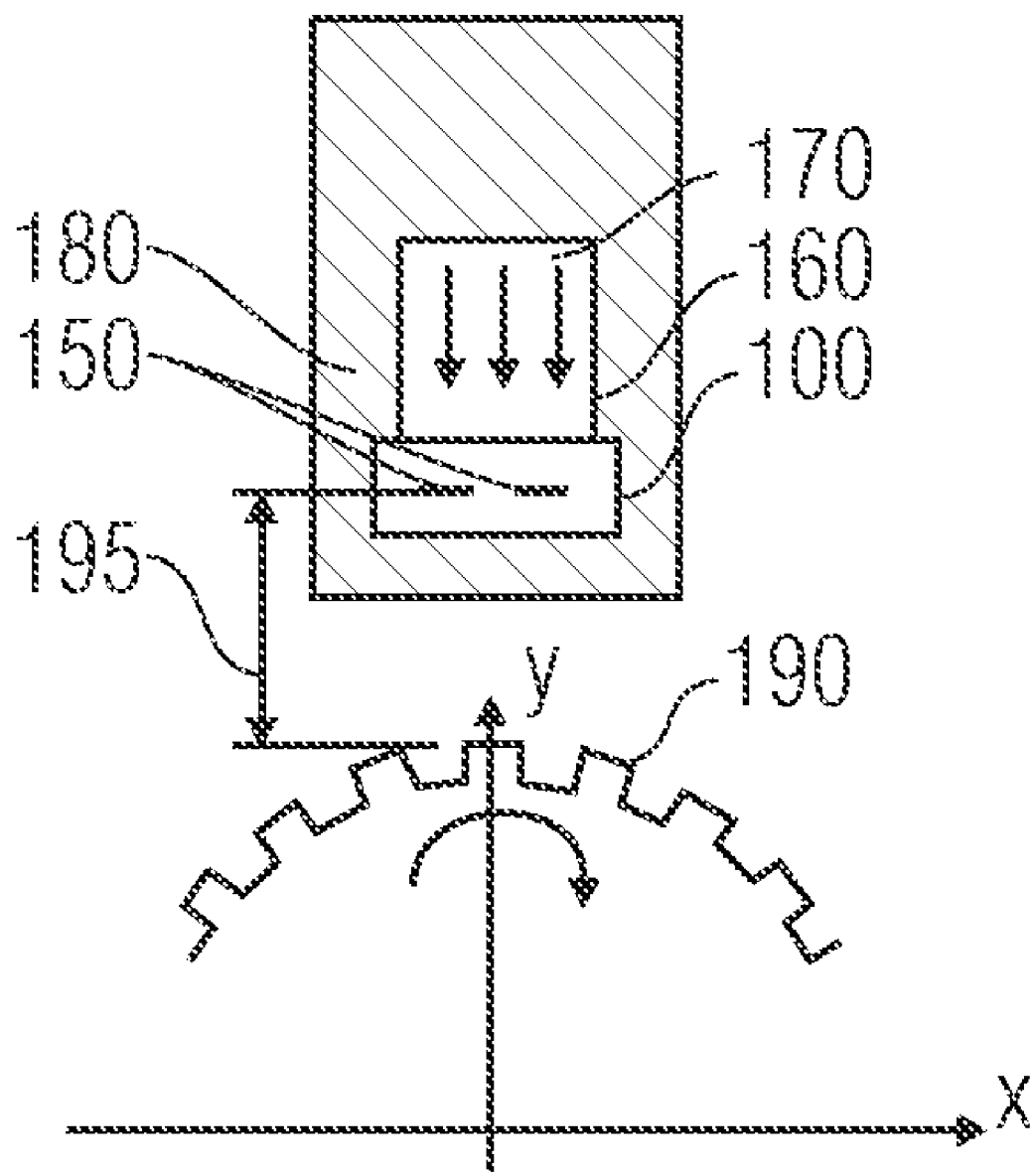
FIG. 2a schematically shows a possible field of application of an embodiment of a magnetic-field sensor.

FIG. 2a shows a possible field of application of an embodiment of a magnetic-field sensor 100. The embodiment of the magnetic-field sensor 100 comprises several magnetosensitive elements or sensor elements 150. The sensor elements 150 may be connected within the framework of measurement arrangements 110, as it was shown within the framework of the embodiment of a magnetic-field sensor 100 shown in FIG. 1. Further details on a corresponding connection of the sensor elements 150 to form measurement arrangements 110 will be explained in greater detail in the context of FIG. 10. As mentioned before, the sensor elements 150 are magnetically sensitive sensor elements, which may, for example, be implemented as Hall sensors or magnetoresistive sensors.

Magnetoresistive sensor elements 150, or also xMR sensor elements, are sensor elements changing their resistance in a reproducible manner under the influence of a magnetic field. Typical magnetoresistive sensor elements are AMR (anisotropic magnetoresistance) sensor elements, GMR (giant magnetoresistance) sensor elements, CMR (colossal magnetoresistance) sensor elements or EMR (extraordinary magnetoresistance) sensor elements, TMR (tunnel magnetoresistance) sensor elements. Moreover, other magnetically sensitive sensor elements 150 may of course also be implemented, such as magnetic diodes, magnetic transistors, magnetic resistors or vertical Hall sensors.

In the example of an application of an embodiment of a magnetic-field sensor 100 shown in FIG. 2a, the magnetic-field sensor 100 is mechanically coupled with a so-called back-bias magnet 160, which is a permanent magnet having a magnetization as illustrated by the arrows 170 in FIG. 2a, in many fields of application. The embodiment of the magnetic-field sensor 100, together with the back-bias magnet 160, is embedded in a protective cover or protective housing 180 and arranged above an indicator object 190.

In the example of application shown in FIG. 2a, the indicator object 190 is a toothed wheel made of a permeable and/or soft-magnetic material, also referred to as permeable target wheel. Basically, however, other indicator objects also may be employed within the framework of the corresponding examples of application, i.e., for example, perforated wheels or hole wheels, gear racks or other objects made of permeable material with a periodic structure, which periodically change a magnetic field caused by the back-bias magnet depending on the motion of the indicator object 190. Depending on the concrete implementation of a magnetic-field sensor 100 within the framework of other examples of an application, implementation of a back-bias magnet 160 may perhaps be omitted. In such a case, the indicator object 190 itself may be constructed as a pole wheel of magnetic material, wherein the periodic structures of the indicator object 190 in this case may also comprise different magnetizations. For example, a periodic magnetization, for example, in the form of alternating magnetic north and south poles, may be implemented in an indicator object 190 instead of a period structure of the shape of the indicator object. A corresponding indicator object 190 often is referred to as a pole wheel or a pole bar.

In this context, it is obvious to mention that the aforementioned periodicity of the magnetic field, of periodic structures (e.g., of the indicator object 190) or of other periodic effects does not have to be related to the complete object or its outer dimension. Hence, for example, in the case of a toothed wheel as an indicator object 190, it may be advisable, in some examples of application, to provide an index gap or another index mark to allow for (absolute) position determination of the indicator object 190. In such a case, the resulting magnetic field does at least have section-wise periodicity, which generally extends over at least two periods or period lengths. In the case of a toothed wheel (with index gap), a period length thus typically is a length of a tooth and of the following gap of a "normal" tooth, i.e., not of the index tooth and/or the index gap. Due to the speed, i.e., for example, linear speed or angular speed, of the indicator object 190, in connection with the lateral extension of the indicator object and the magnetic-field sensors or sensors, a magnetic field spatially and temporally periodic at least in section-wise manner develops in the case described above.

Examples of application, as schematically outlined in FIG. 2a, in the field of the automobile industry, for example, originate from the application in the field of ABS (anti-blocking system) systems, crank shaft sensors and camshaft sensors, in which the movement of the wheels and/or corresponding shafts is detected by means of magnetic sensors. Here, among other things, toothed wheels with small permanent magnets as indicator object 190 on the backside of the sensors are used. Through the movement of the wheel, a, for example, sine-shaped magnetic field periodic in at least section-wise manner, which may be detected via the sensor elements 150 concerned, develops at the sensor. In magnetoresistive sensor elements 150 (xMR sensor elements), the component of the magnetic field in the chip plane of the embodiment of the magnetic-field sensor 100 is often evaluated here if the embodiment concerned is implemented within the framework of a thin-layer process as a corresponding thin-layer device on a chip or substrate. Depending on the concrete implementation of an embodiment of a magnetic-field sensor 100, the rotation direction of the wheel may also be evaluated at the same time, as this is indicated in FIG. 2a. Hence, an indicator object may be part of a shaft, a wheel or another moving component or be mechanically coupled to a corresponding object or a corresponding component, depending on the concrete application scenario.

Here, in many applications, as also illustrated by FIG. 2a, a small permanent magnet, namely the back-bias magnet 160, is attached to the magnetic-field sensor 100, and both are arranged in front of and/or above a toothed-wheel-shaped permeable plate, wherein a distance between the sensor elements 150 and the indicator object 190 also is referred to as magnetic air gap, as this also is depicted in the form of the arrow 195 in FIG. 2a. If the disc or indicator object 190 is rotated, the teeth of the indicator object 190 pass the sensor and generate small (magnetic) field variations detected by the sensor and having information on the angle position and/or the rotational speed of the indicator object 190 or disc 190. Depending on the concrete implementation, the periodic field changes may have an almost sine-shaped waveform, with an amplitude of this waveform decreasing strongly with a growing air gap 195 between the sensor 100 and the indicator object 190.

Here, it may occur that, even if a center of a gap of the indicator object 190, i.e., the center between two teeth of the indicator object 190, comes to lie exactly between two magnetoresistive sensor elements 150, which corresponds to a position x=0 in the following, the flux lines of the magnet diverge, whereby prohibitively large magnetic field components in x direction (Bx component) act on the magnetoresistive sensor elements concerned. Hereby, it may happen that the two magnetoresistive sensor elements are driven into saturation and therefore no longer give off any signal.

Figure 2B:
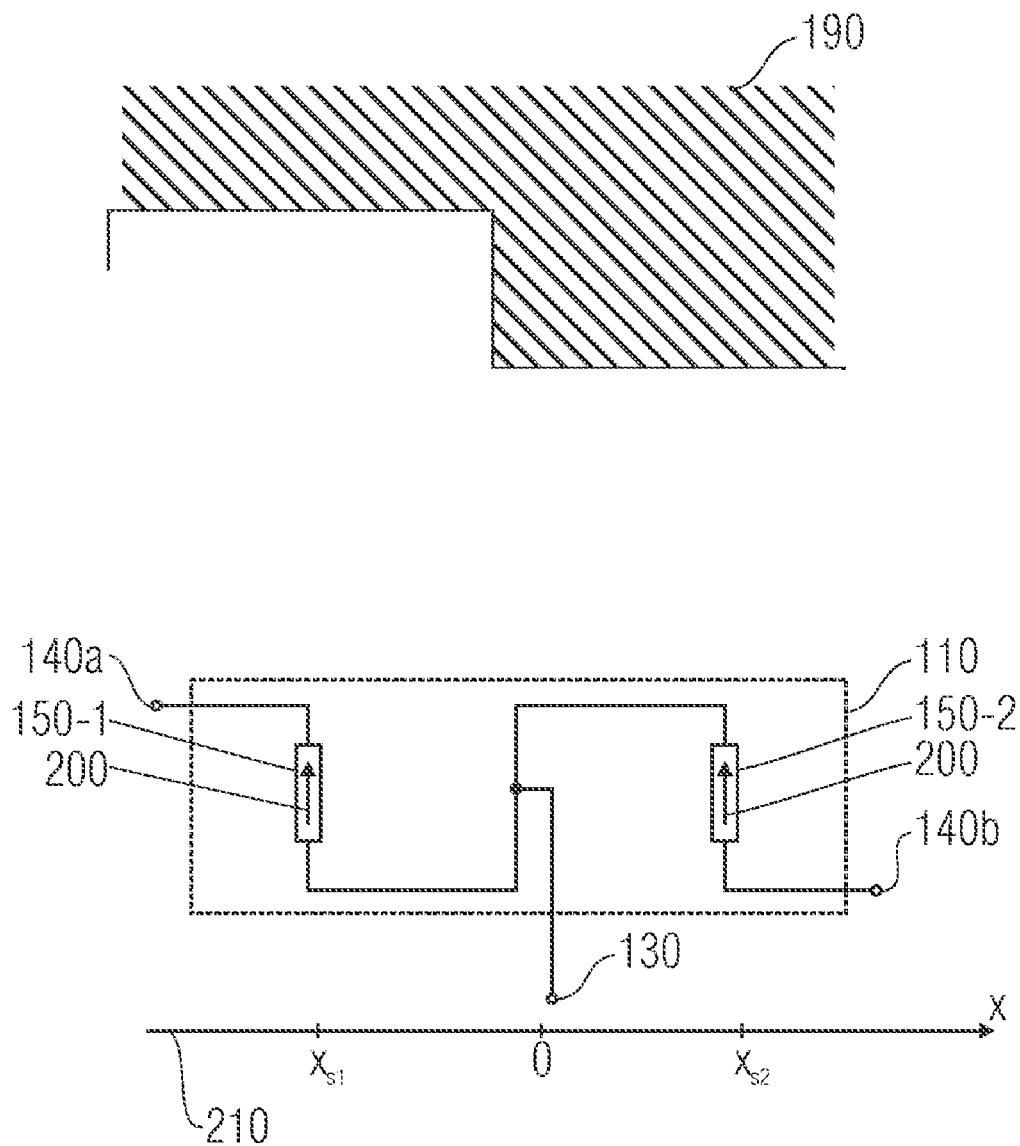
FIG. 2b schematically shows a possible arrangement of sensor elements of a measurement arrangement within the framework of an application.

So as to illustrate this in greater detail, a measurement arrangement 110 in form of a half-bridge circuit with a first sensor element 150-1 and a second sensor element 150-2, which may, for example, be magnetoresistive sensor elements, i.e., GMR sensor elements, for example, is depicted in FIG. 2b. If the two sensor elements 150 of the measurement arrangement 110 in FIG. 2b are GMR sensor elements, these also often have, apart from the actual layers responsible for the GMR effect, also a hard-magnetic layer, which may, for example, be a layer stack known as a synthetic antiferromagnet (SAF).

This hard-magnetic layer or SAF is often provided with a magnetic direction or preferential direction indicated by the arrows within the two sensor elements 150 in FIG. 2b, within the framework of a so-called conditioning process. In the case of a GMR sensor element 150, if a magnetic field with a component in the plane of the GMR sensor elements acts thereon such that a component in the direction of the conditioning 200 is present, the GMR sensor element concerned has a resistance value smaller than a resistance value in the case of the respective component of the external magnetic field being opposite to the conditioning 200.

Thus, the measurement arrangement shown in FIG. 2b represents a half-bridge circuit in which a supply voltage, such as a positive supply voltage, may, for example, be applied to a terminal 140a, while a corresponding further supply voltage, i.e., maybe a negative supply voltage or a reference potential, may be applied to a further terminal 140b, such that a voltage signal dependent on a magnetic field acting on the two sensor elements 150 with respect to the component of the conditioning 200 may be tapped as a measuring signal at a measurement tap 130, which is also referred to as a center tap in the case of a half-bridge circuit and is arranged between the two sensor elements 150-1 and 150-2 connected in series. More specifically, the measuring signal that can be taken at the measurement tap 130 is dependent on a difference of the magnetic field component acting on the two sensor elements 150 with respect to the conditioning 200. In this case, the two sensor elements 150-1 and 150-2, due to their series connection, act as voltage splitters with a variable voltage splitting ratio dependent on the external magnetic field or its component with respect to the conditioning 200.

For example, if the measurement arrangement 110 is exposed to a permanent magnetic field by a back-bias magnet not shown in FIG. 2b and this is influenced by an indicator object 190 in the form of a toothed wheel, for example, it may lead to a corresponding changing magnetic field with respect to the direction of the conditioning 200 depending on the geometric arrangement and connection of the individual sensor elements 150, which leads to a corresponding change of the voltage signal or measuring signal present at the measurement tap 130.

With respect to the geometric arrangement of the two sensor elements 150-1, 150-2, for example, a corresponding measuring signal may be generated at the measurement tap 130 if a tooth length or a gap length of the indicator object 190 matches the distance of the two sensor elements 150-1, 150-2 with respect to the rotation direction of the indicator object 190, for example. If the exact position of the individual sensor elements 150-1, 150-2 with respect to an X axis 210, as it is depicted in FIG. 2b, is designated with $x_{S1}$ and $x_{S2}$, a tooth length or a gap length, which is also referred to as a so-called pitch p, thus corresponds to roughly the difference of the two X coordinates of the two sensor elements 150. In other words, the pitch p (or also $\lambda$) corresponds to the difference of the x coordinate $x_{S2}$ and the x coordinate $x_{S1}$ in this case.

If the x axis 210, like also in the further course, is related to a center position of the back-bias magnet not depicted in FIG. 2b, so that it has the x coordinate x=0, the two sensor elements 150-1, 150-2 have, in the case of an ideal positioning with respect to the back-bias magnet, x coordinates identical in magnitude and differing only by sign. In other words, in such a case ideally $x_{S1} = -x_{S2}$ applies.

One way of at least reducing the possible divergence of the flux lines described in connection with FIG. 2a so as to not drive the sensor elements 150 into a saturation, if required, is to use a so-called split magnet, which has a recess, i.e., for example, a groove, at the center. Hereby, it is possible to "bend straight" the field lines, so that the x component of the magnetic field (Bx component) in the case of passing through the sensor elements 150, i.e., the magnetoresistive sensor elements 150, is decreased to such an extent that these are not necessarily driven into saturation. An important issue in this context, however, is that the magnetoresistive sensors in this case should be positioned in an extremely exact manner with respect to the position of the magnet, since already small positional errors, for example, on the order of 0.1 mm, may overdrive the magnetoresistive sensor elements 150 or drive same into saturation, in spite of using the split magnet.

In the case of many embodiments of magnetic-field sensors 100, it may therefore be advisable to perform the most exact positioning possible of the magnetic-field sensors with respect to a back-bias magnet that may be present. In the context of FIGS. 3a to 7, in the case of an embodiment of a magnetic-field sensor with a back-bias magnet, it is illustrated that a gradient of the flux density component acting on a GMR sensor element 150 may be on the order of 100 mT/mm. Thus, this example illustrates that at least within the context of the parameters described in the following, positioning with an accuracy of less than 0.25 mm is indispensable, since otherwise there is the danger that the respective magnetoresistive sensor elements 150 could be driven into saturation. A reduction in sensitivity of the magnetoresistive sensor elements 150, so that they go into saturation only at higher fields, seems to be less advantageous in this connection, because exactly this goes against using magnetoresistive sensor elements, particularly GMR sensor elements, which present high sensitivity.

Figure 3A:
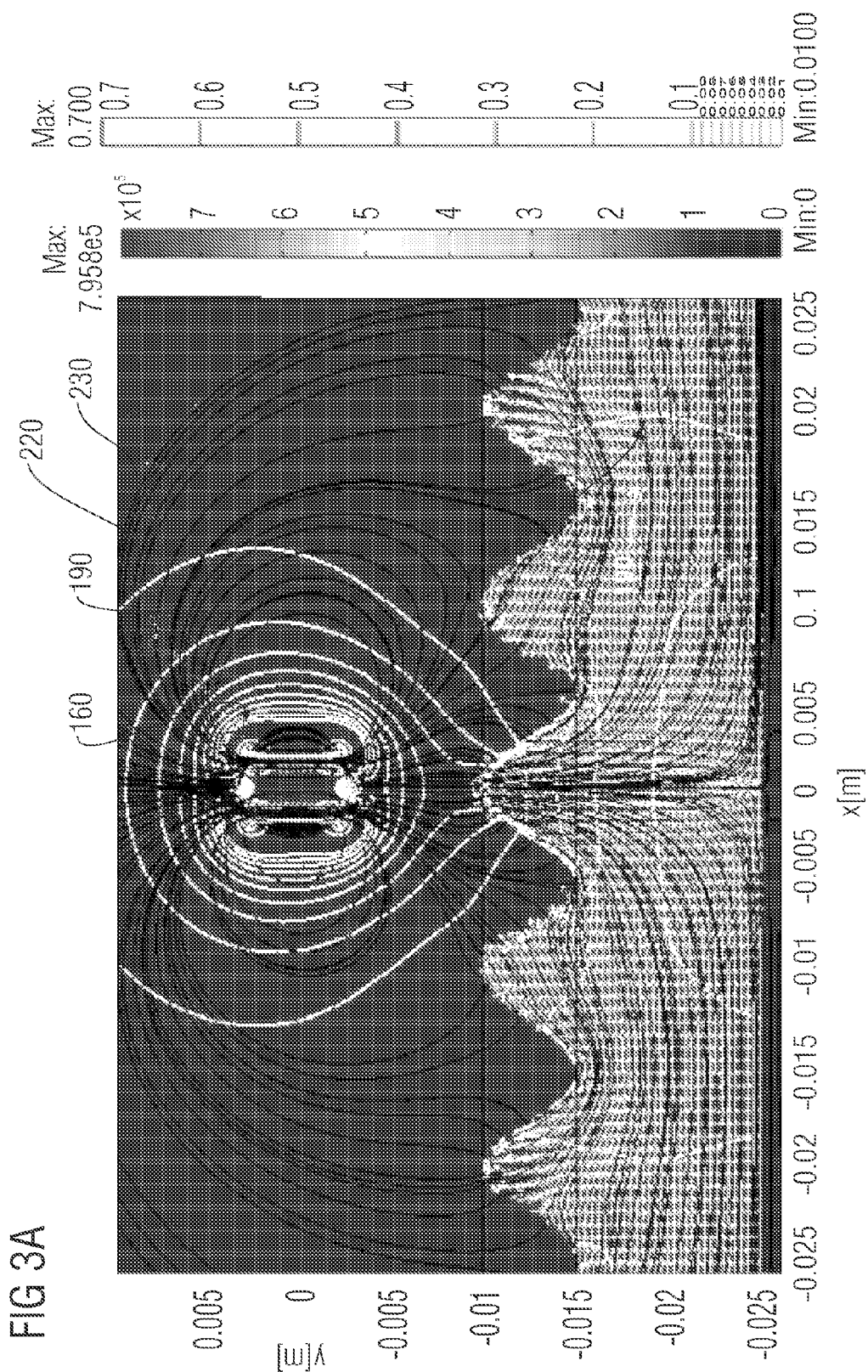

The numerical simulation results shown in the following are based on an FEM (finite element method) simulation, which is based on a block magnet having a diameter of 4 mm, a height of 5 mm and a (central) bore with a diameter of 2 mm. The center of gravity of the magnet coincides with the origin of the coordinate system underlying the simulation within the framework of the following calculations. The magnet or back-bias magnet is magnetized homogeneously with a remanent magnetic field or a remanent flux density Brem=1T in a vertical direction, i.e., in the y direction. The toothed wheel acting as indicator object 190 has a relative permeability of $\mu r=1600$. The teeth of the toothed wheel are formed to be cosine-shaped with a period of 10 mm and a height of 5 mm each. The bottom side of the magnet illustrated in the figures is arranged 7.5 mm above the teeth. With respect to the position of the toothed wheel, FIG. 3a shows a result of a numeric simulation in which the toothed wheel is at a position x1=0 mm, or at x1=10 mm due to the permeability of the toothed wheel. This position corresponds to just one tooth of the toothed wheel 190 on the symmetry line of the magnet 160. In comparison, FIG. 3b shows the position at which the indicator object or the toothed wheel 190 has an x position corresponding to an x coordinate of x1=5 mm, i.e., at which a gap of the toothed wheel is lying on the symmetry line of the magnet 160. In the FIGS. 3a and 3b, the horizontal direction is of course in accord with the x axis, while the vertical direction corresponds to the Y axis. As a result, FIG. 3a and FIG. 3b show the two extreme positions of the toothed wheel 190 with respect to the magnet 160. Here, in FIGS. 3a and 3b, a magnetization within the indicator object 190, contour lines 220 relating to the magnetic flux density, and magnetic field lines 230 are also shown in the form of small arrows, apart from the individual structures of the back-bias magnet 160 and of the indicator object 190.

Figure 4:
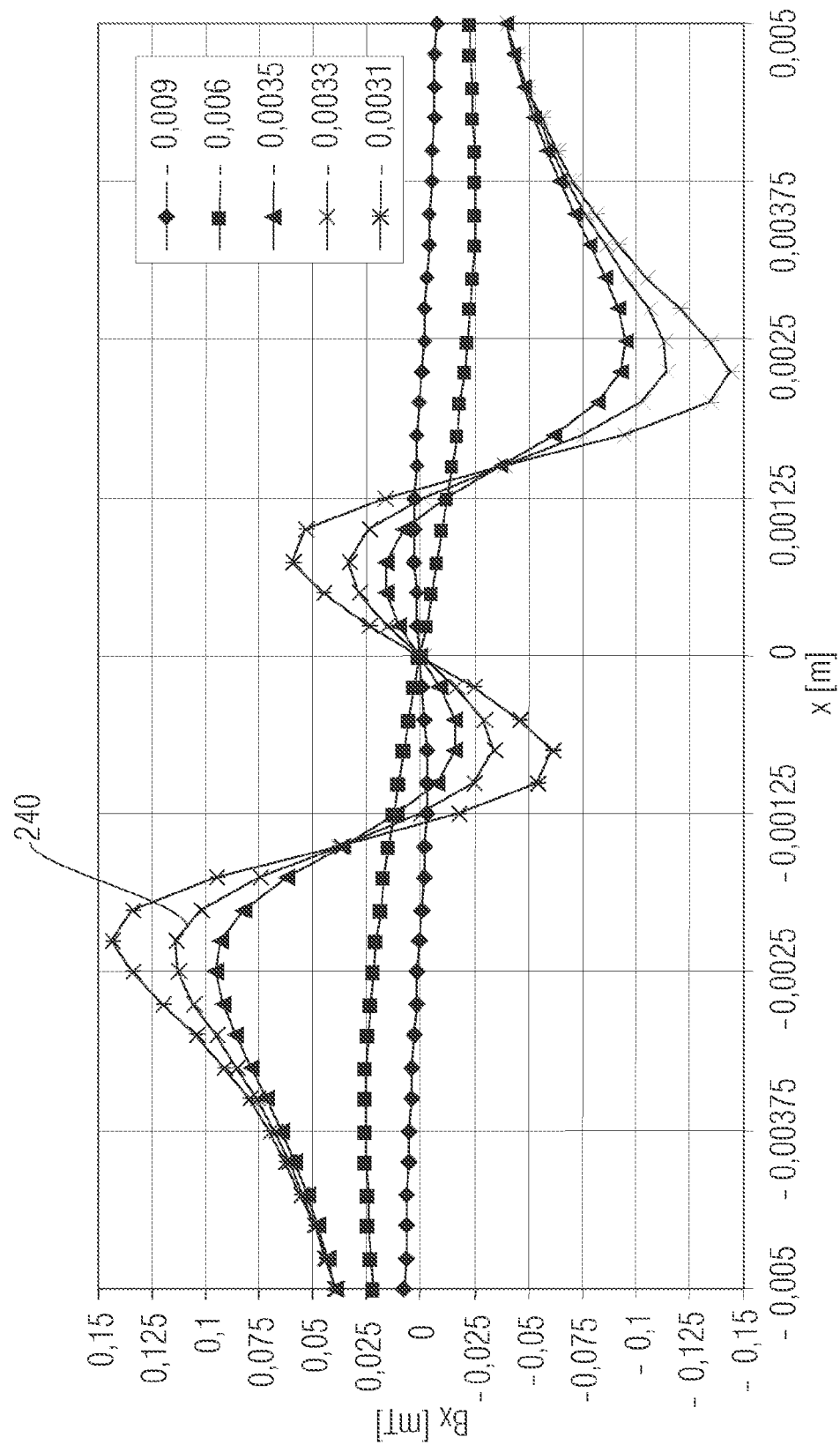
FIG. 4 shows an illustration of a strength of a magnetic-field component.

On the basis of numerical simulations, as, for example, shown in FIGS. 3a and 3b, FIG. 4 shows a component of the magnetic field in x direction as a function of the x coordinate for the case that the toothed wheel 190 comes to lie at a position x1=0 mm, i.e., in the case that exactly a tooth of the toothed wheel 190 comes to lie on the symmetry axis of the back-bias magnet 160. More specifically, FIG. 4 shows the corresponding dependence of the x component of the magnetic field as a function of the x coordinate for a total of five different planes on which the sensor elements 150, i.e., for example, the GMR sensor elements, may be arranged. As the respective parameter, here the y position of the plane involved and/or the sensor elements 150 involved is indicated, wherein the back-bias magnet 160 is at a y position of y=0.0025 m=−2.5 mm, as explained before.

All five courses shown in FIG. 4 substantially have a point-symmetrical course with respect to the point (x, Bx)=(0 m, 0 T). Furthermore, all five courses have more or less strongly pronounced periodicity with respect to the x component of the magnetic field.

The course 240 shown in FIG. 4, which corresponds to a y plane with the y coordinate y=0.0033 m=−3.3 mm, shows at the X coordinates x=+/−1.25 mm that the relevant x component Bx of the magnetic flux density substantially disappears or takes on a sufficiently small magnitude value if the GMR sensor elements 150 are arranged at a distance of about 0.8 mm below the bottom surface of the magnet. In other words, the course 240, which is based on the y parameter of y=−3.3 mm, corresponds to just a distance of 0.8 mm of the respective plane below the lower surface of the back-bias magnet 160, wherein the previously described extension of the back-bias magnet 160 with a height of 5 mm and an arrangement with respect to the coordinate system used in FIGS. 3a and 3b has been taken into account. In other words, basically two magnetoresistive or GMR sensor elements 150-1, 150-2 may be arranged at the coordinates $x_{S1}=-1.25$ mm and $x_{S2}=+1.25$ mm, without driving the respective GMR sensor elements 150 into saturation. But the course 240 in FIG. 4 shows that, should the two sensor elements 150 have a lateral mispositioning of 0.25 mm, the respective GMR sensor elements 150 already are deep in the area of saturation with respect to the x component of the magnetic field. A corresponding lateral mispositioning of the two sensor elements 150 thus would lead to an x component of the magnetic field lying clearly above 20 mT in magnitude, which corresponds to a typical saturation boundary, depending on the exact implementation of a sensor element.

Figure 5:
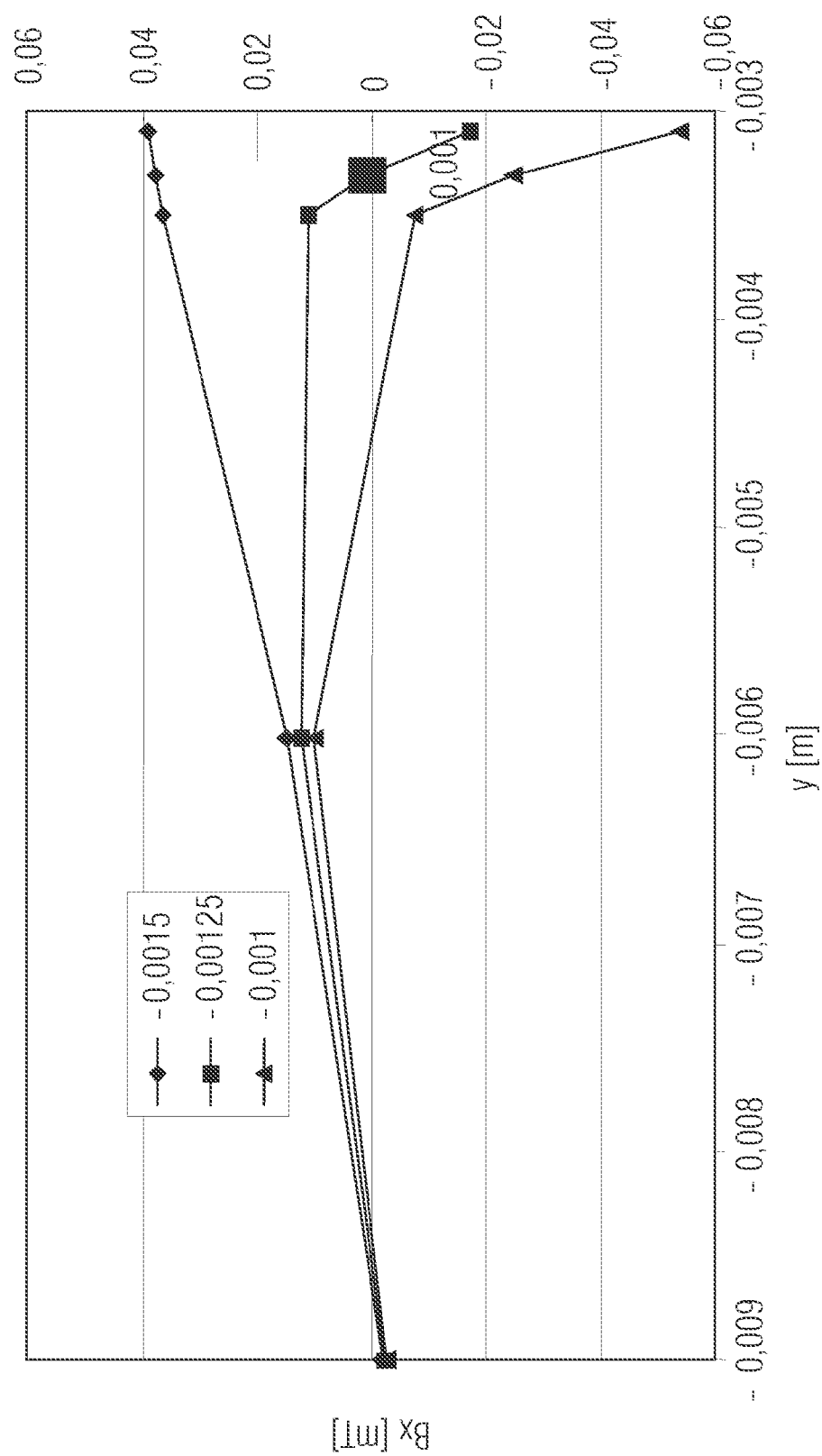
FIG. 5 shows a further illustration of a strength of a magnetic-field component.

Moreover, FIG. 5 shows a plot of various courses of the x component Bx of the magnetic flux density as a function of the y coordinate for the case shown in FIG. 3a for a tooth of the indicator object 190 lying on the symmetry axis or symmetry line of the back-bias magnet 160, which corresponds to the case of x=0. More specifically, FIG. 5 here shows three different courses, in which the x position in the sensor elements 150 was varied as the parameters.

Moreover, the courses in FIG. 5 show that, for the above-mentioned deviations of ±0.25 mm from the above-mentioned positions x=+/−1.25 mm—apart from very small y parameters below about −6 mm, the respective x component Bx of the magnetic flux density caused by the back-bias magnet 160 in connection with the indicator object 190 would be very likely to drive a magnetoresistive sensor 150 arranged at the respective positions into saturation.

Depending on the concrete implementation of an embodiment of a magnetic-field sensor 100, this may include, apart from the above-described plurality of measurement arrangements 110, additional measurement arrangements of sensor elements, for example, serving for the sensing and/or measurement of further magnetic field-specific quantities. In some embodiments of a magnetic-field sensor 100, for example, a third sensor element 150 on the basis of which an additional measuring quantity may be detected or sensed is connected centrally between the sensor elements 150-1 and 150-2 shown in FIG. 2b, for example. For example, if an embodiment of a magnetic-field sensor 100 is implemented within the framework of an incremental speed sensor on the basis of magnetoresistive sensor elements, an arrangement of the measurement arrangement 110 with its two sensor elements 150-1, 150-2, as it is exemplarily shown in FIG. 2b, may be used to tap a speed signal or a measuring signal having information with respect to a speed of the indicator object 190 at the measurement tap 130. The above-explained, optional further or third sensor element, which is not shown in FIG. 2b, may be employed for measurement or determination of a direction of an indicator object 190, in this context. In other words, in the situation shown in FIG. 2b, basically a direction signal on the basis of the measurement of an x component of the magnetic field Bx may occur at the location x=0.

Moreover, it is possible to define a speed signal by determining a difference of the magnetic flux density predominant at the locations x=+1.25 mm and x=−1.25 mm with respect to the x component. Since the properties, features and other qualities of the respective sensor elements 150 of course also have an influence, as well as the evaluation methods or sense circuits still to be explained in the following, it may thus be stated that the direction signal in the above-described embodiment of a magnetic-field sensor 100 is based on the x component of the magnetic flux density Bx at the location x=0.

Correspondingly, a speed signal is based on a difference of the respective components of the magnetic flux density at the locations of the sensor elements 150 in many embodiments of the magnetic-field sensor 100, as it was explained before. In terms of circuit technology, this may, for example, be realized by connecting the two sensor elements 150-1, 150-2 in form of a bridge circuit with a center tap as measurement tap 130 of the measurement arrangement 110, as it was shown in FIG. 2b.

Figure 6:
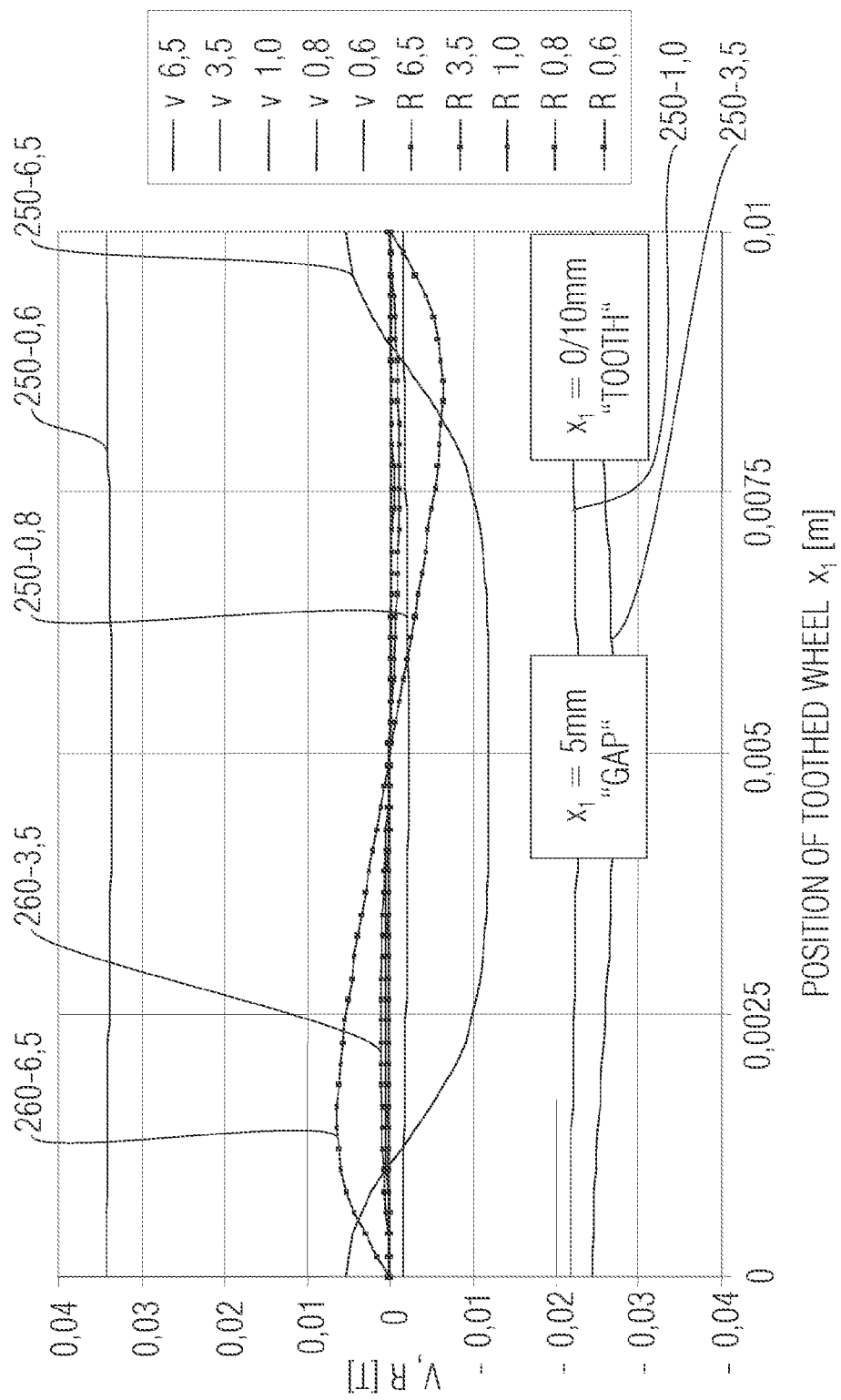
FIG. 6 shows an illustration of measuring signal courses of an embodiment of a magnetic-field sensor with a back-bias magnet and a toothed wheel as an indicator object.

Further assuming that the two sensor elements 150 are at the locations $x_{S1}$=−1.25 mm and $x_{S2}$=+1.25 mm, the speed signal in this case thus, for example, is based on the difference of the x components of the magnetic flux density Bx at these two locations, i.e. on Bx (x=+1.25 mm)−Bx (x=−1.25 mm). FIG. 6 shows a corresponding speed signal v and/or the difference of the x component of the magnetic flux density at the two previously explained locations, on the basis of which a speed signal is determined, as a function of the position of the toothed wheel x1 for various distances between the GMR sensor elements 150 and a back-bias magnet in the case of a corresponding back-bias GMR system. The various speed courses v shown in FIG. 6 here do not represent the actual speed signal, which a corresponding evaluation circuit could provide as an output signal, but rather only the above-explained difference of the x components of the magnetic flux density. For this reason, the speed signal v also is represented in units of the magnetic flux density, Tesla (T), in FIG. 6.

Thus, FIG. 6 shows a total of five different speed signal courses v 250-6,5 250-3,5, 250-1,0, 250-0,8 and 250-0,6.

Moreover, FIG. 6 also shows five accompanying direction signal courses R 260-6,5, 260-3,5, 260-1,0, 260-0,8 and 260-0,6, which again are not the actual direction signal, but rather the x component of the magnetic flux density Bx at the location x=0. In other words, the direction signal R in this case also is represented in units of the magnetic flux density, Tesla (T).

The calculations shown in FIG. 6 here are based on a tooth width of 5 mm, a gap width of 5 mm, a relative permeability $\mu_r$=1600 and a remanent magnetization or a remanent magnetic flux density Brem=1 T of the back-bias magnet 160 and/or the indicator object 190. The distance between a tooth and the magnet again is 7.5 mm, wherein this again is a so-called split magnet with a width of 4 mm and a height of 5 mm with a central bore with a diameter of 2 mm. The back-bias magnet 160 here again is magnetized homogenously in the y direction. The speed signal v here is based on a distance from left to right of 2.5 mm, due to the above-described positioning of the sensor elements 150. The speed courses 250 thus are based on the difference of the respective components of the magnetic flux density, while the direction courses 260 are based on the respective component of the magnetic flux density at the location lying centrally therebetween.

In FIG. 6, it is also depicted that a position of the toothed wheel of x1=5 mm corresponds to a position of the magnet above a gap of the toothed wheel of the indicator object 190, while the positions x1=0 mm or x1=10 mm correspond to a position of the magnet above a tooth of the toothed wheel.

While the direction courses 260, apart from the direction course 260-6,5, comprise x components of partly more than 5 mT for some positions of the toothed wheel for a distance of 6.5 mm of the center elements 150 from the back-bias magnet, the further four direction courses 260 shown in FIG. 6 show flux density values of clearly less than 10 mT with respect to the x component. In contrast hereto, the speed courses 250, with respect to typical saturation boundaries of GMR sensor elements, do not have acceptably large zero offsets, except for in a narrow range of the distance of the GMR sensor elements to the back-bias magnet, wherein the magnet is arranged about 0.7 to 0.9 mm above the chip surface or substrate surface of the embodiment of the magnetic sensor 100. In other words, a position of the magnet 160 of about 0.7 to 0.9 mm above the GMR sensor elements leads to a permanently predominant magnetic flux density with respect to the x component, which will not lead to saturation of the GMR sensor elements 150 which can be used for the speed analysis.

The magnetic zero offset (magnetic offset) at the positions of the three GMR sensor elements at x=0 mm and x=+/−1.25 mm, as it was shown in FIG. 6, is below a value of 10 mT, if the magnet is in a range from 0.7 mm to 0.9 mm above the chip surface, i.e., at y coordinates between y=−2.2 mm and −3.4 mm considering the size and dimension of the back-bias magnet 190. So as to illustrate this in greater detail, FIG. 7 shows an illustration of the magnetic zero point and/or the mean magnetic field $B_0$ present at various locations, which is also referred to as an offset and, as a mean value, corresponds to the x component of the magnetic flux density Bx averaged over a period of a movement of the toothed wheel from x1=0 to x1=10 mm.

Figure 7:
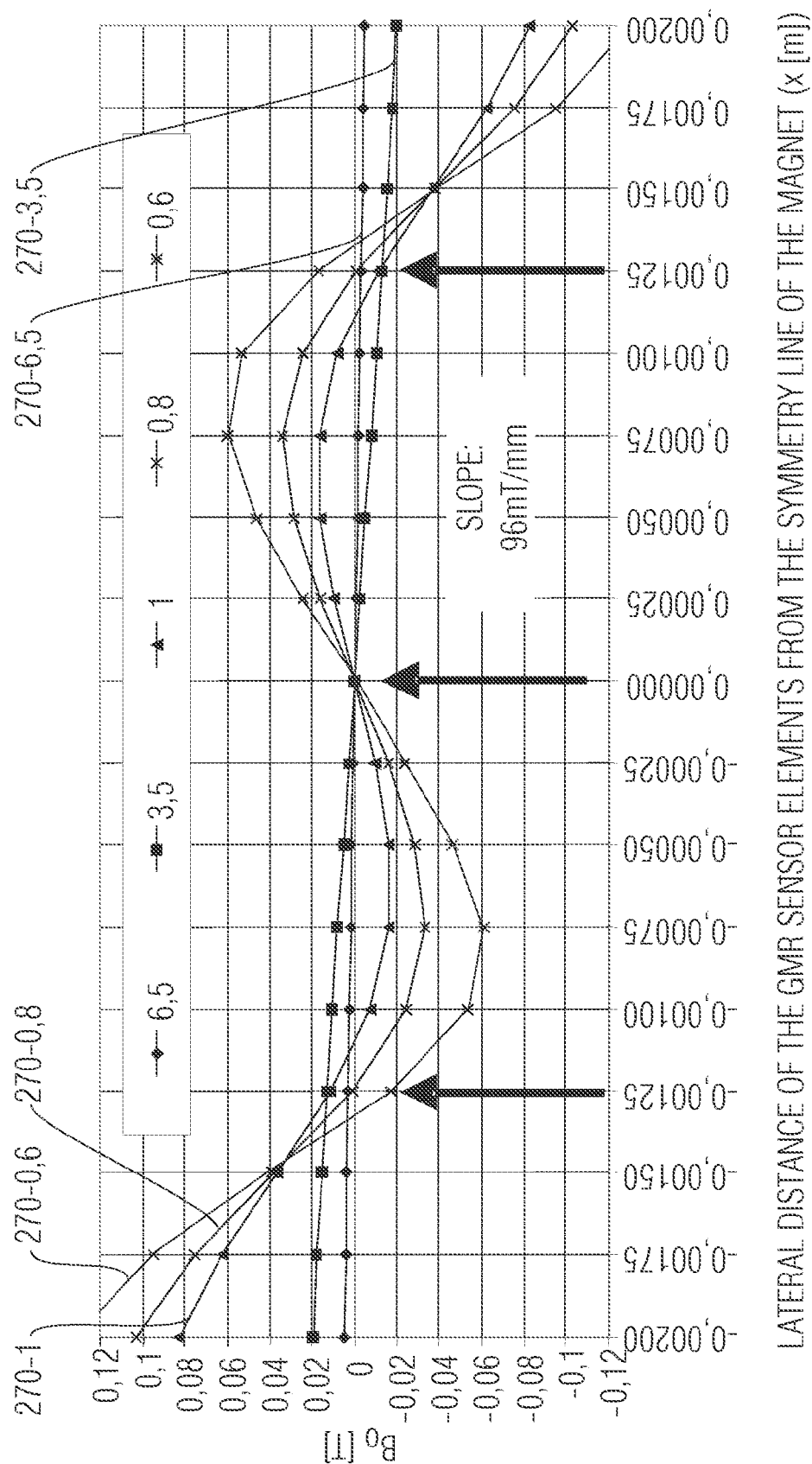
FIG. 7 shows an illustration of a magnetic zero shift depending on a lateral position from a center of a back-bias magnet in connection with an embodiment of a magnetic-field sensor.

Thus, FIG. 7 shows, for various distances of the GMR sensor elements to the magnet or back-bias magnet between 0.6 mm and 6.5 mm, the magnetic mean value or offset $B_0$ as a function of the lateral distance from the symmetry line or central line of the back-bias magnet, i.e., in an x direction. The courses shown in FIG. 7 here again are based on a distance of 7.5 mm between the magnets or back-bias magnets 160 and a tooth of the toothed wheel 190.

More specifically, FIG. 7 shows a total of five offset courses 270-6,5, 270-3,5, 270-1, 270-0,8 and 270-0,6, wherein the reference numeral of the individual offset courses was again supplemented by the above-mentioned parameter of the distance between the GMR element and the back-bias magnet or magnet. Furthermore, FIG. 7 again shows, in the form of three arrows at x=−0.0125 m, at x=0 m and at x=+0.0125 m, the positions of the various GMR sensor elements 150, as explained exemplarily in connection with FIGS. 3a to 6, within the framework of the measurement arrangement 110 and the optional additional sensor element in a central position between the two sensor elements of the measurement arrangement, at which the derivation of a direction signal is determined. The offset courses 270, as shown in FIG. 7, also have a point-symmetrical course with respect to the point (Bx, x)=(0 T, 0 m), which further shows oscillatory behavior in the x range shown with respect to the distances of 1 mm, 0.8 mm and 0.6 mm (offset courses 270-1, 270-0,8, 270-0,6).

The course 270-0,6, which corresponds to a distance of 0.6 mm of the GMR sensor element 150 from the back-bias magnet 160, has a slope of more than 200 mT/mm in magnitude in the range of the x coordinates of the two sensor elements 150 at x=+/−0.00125 m=+/−1.25 mm. The offset course 270-0,8, which corresponds to a y parameter of y=0.8 mm and/or a distance of 0.8 mm between the GMR sensor element 150 and the back-bias magnet 160, clearly has a smaller slope of about 96 mT/mm in magnitude in this range. Nevertheless, for many applications, such a slope is to be regarded as very steep, since small lateral shifts of the chip or the bias magnet of an embodiment of a magnetic-field sensor 100 may already lead to the fact that the back-bias magnet may already drive GMR sensor elements 150 to saturation.

A corresponding lateral positional tolerance between the magnet 160 and the chip with an embodiment of a magnetic-field sensor 100 may, on the one hand, already be caused by the chip being glued onto the so-called lead frame within the framework of the fabrication of the final sensor or sensor module within the framework of the so-called die-attach process, wherein positional tolerances of +/−150 μm are perfectly common. On the other hand, the (back-bias) magnet 160 also is glued to the backside within the framework of the above-mentioned module assembly, i.e., within the framework of finishing the finished sensor module, wherein once again positioning tolerances of about 150 μm are not unusual at all.

Within the framework of such a distribution, for example, a Gaussian distribution, a 3-sigma positional tolerance of 0.21 mm between the magnetoresistive sensor element (xMR sensor element) and the accompanying magnet thus may be assumed. Within the framework of a previously described arrangement of back-bias magnet 160 and the chip of an embodiment of a magnetic-field sensor 100 with a field gradient of about 100 mT/mm in magnitude, it may have to be assumed that the individual magnetoresistive sensor elements are subject to magnetic mean values or magnetic offsets of up to +/−21 mT. Moreover, these magnetic offsets may increase further if the magnetization of the magnet is not perfectly homogeneous or the magnet suffers from irregularities.

Depending on the concrete implementation of the individual sensor elements, particularly in the case of GMR sensor elements 150, these numbers make clear that an improvement of the possible positional tolerances in the case of embodiments of a magnetic-field sensor 100 may clearly be advantageous. For example, sensitive GMR sensor elements thus may already saturate at fields of about 5 mT, so that a reduction of the positional tolerances by at least a factor of 5 would be the result in such a case, taking the above-mentioned numbers into account, so that such GMR sensor elements can be used within the framework of magnetic-field sensors, taking the above-discussed positioning tolerances into consideration.

Especially when using magnetic-field sensors for incremental speed measurement, often rotating metal wheels or perforated discs are used as indicator objects 190 for generating the magnetic field deflection needed, as explained before. The magnetic fields to be modulated here are generated by back-bias magnets, which generally are behind the sensor or magnetic-field sensor. Such a construction may, however, lead to the discussed problem of the positioning accuracy of the (back-bias) magnet 160 potentially leading to sensitivity variations between the individual sensor elements of differential measurement arrangements and potentially also to zero offsets with respect to the measurements. Furthermore, inaccuracies in the positioning of the system of magnet and sensor, which is coupled to a drive shaft, a crank shaft, a gear shaft, a cam shaft or another rotation component, in the case of an automobile application, in front of the toothed wheel may occur additionally.

While this might be tolerable in the case of Hall sensors being employed, because a magnetic field in the direction perpendicular to the sensor can be generated with comparably good homogeneity over the entire positioning range of the sensor and generally there is no technically relevant physical limitation of the measuring field by the saturation of the sensor, a mispositioning in magnetoresistive sensor elements may lead to field changes leading to clear measurement corruptions. Such field changes by the toothed wheel and another indicator object 190 thus may be perceived differently at different positions on the chip by the individual sensor elements 150 with respect to the zero point (offset), sensitivity, phase location and saturation effects so that differential measurement is only difficult to interpret or cannot be interpreted reasonably any more.

Figure 8:
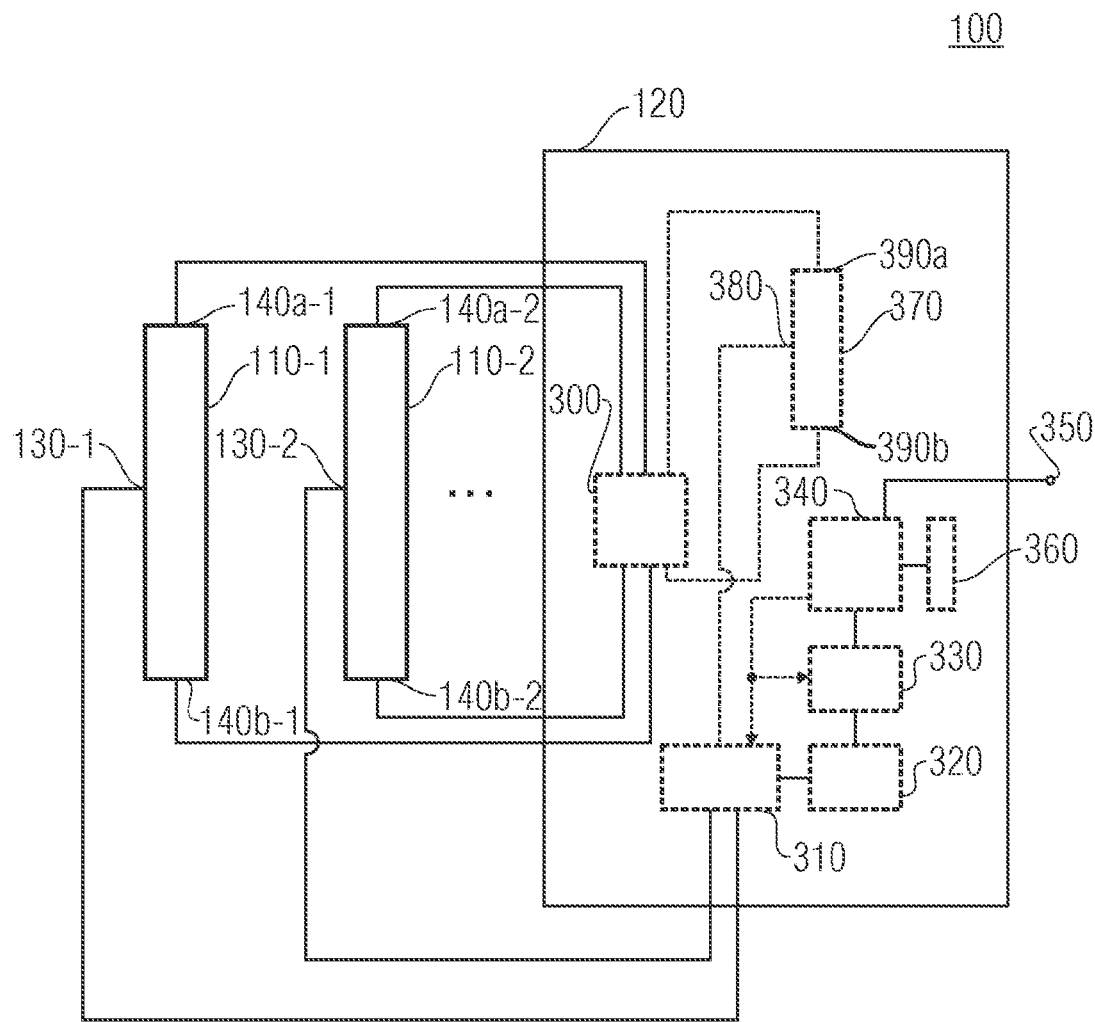
FIG. 8 shows a further block circuit diagram of an embodiment of a magnetic-field sensor.

FIG. 8 shows a further embodiment of a magnetic-field sensor 100, which differs from the embodiment shown in FIG. 1 only with respect to the sensor circuit or control circuit 120. Thus, the control circuit 120 includes, as an optional component, a supply circuit 300 coupled to the terminals 140a and 140b each of the individual measurement arrangements 110. The supply circuit 300 may, for example, be constructed as a voltage supply circuit or also a current supply circuit. Depending on the concrete implementation of an embodiment of a magnetic-field sensor 100, the control circuit 120 thus may supply the individual measurement arrangements, several measurement arrangements or all measurement arrangements 110 via the supply circuit 300 with the aid of an excitation signal, so that corresponding measuring signals can be tapped at the measurement taps 130 of the measurement arrangements 110.

The supply circuit 300 may here be formed so that it outputs direct-current or direct-voltage signals or alternating-current or alternating-voltage signals as excitation signals to the individual measurement arrangements 110, depending on the concrete implementation of an embodiment of a measurement arrangement 100. Moreover, the supply circuit 300 may impress both voltages and currents in the individual measurement arrangements 110 as excitation signal, depending on the concrete implementation and requirement.

In the case of a voltage supply circuit as supply circuit 300, it may, for example, have a regulating circuit, which generates a regulated direct or alternating voltage from a supply voltage of the magnetic-field sensor 100. A bandgap voltage source may also be implemented within the framework of the supply circuit 300, if required. In the case of a supply circuit 300 outputting direct or alternating current to the measurement arrangements 110, it may, for example, also be implemented on the basis of a regulated circuit or also with the aid of a current mirror circuit into which a defined current is impressed via a bandgap voltage supply circuit together with a resistance element. Depending on the concrete implementation, for example, a corresponding current mirror circuit may then scale the respective current correspondingly highly with respect to the requirements of the measurement arrangements 110.

Depending on the requirement, the supply circuit 300 may further also generate a combined direct/alternating-current signal or a combined direct/alternating-voltage signal, in which a corresponding alternating-current or alternating-voltage component is impressed on a corresponding direct-current or direct-voltage component.

The measurement taps 130 of the measurement arrangements 110 are coupled to a multiplexer 310, which is coupled to an analog-digital converter 320 via an output, in the embodiment of a magnetic-field sensor 100 shown in FIG. 8. The multiplexer 310 here is capable of relaying signals present at various inputs of the multiplexer 310 to the output of the multiplexer 310, depending on an external control signal or also on the basis of an internal connection, if required. If the multiplexer 310 is one that connects the individual inputs to the output based on an internal connection, this may, for example, be done on the basis of an internally determined order or sequence.

The analog-digital converter 320 then converts the analog data incoming at an input into digital data, so that the control circuit 120 may be implemented digitally at least with respect to components arranged downstream of the analog-digital converter 320. However, it should be noted at this point that implementation of an analog-digital converter 320 within the framework of the control circuit 120 may basically be omitted, for example, if analog signal processing is to be implemented.

The output of the analog-digital converter 320 is coupled to a pre-processing circuit 330, which may, for example, perform filtering of the signal received from the analog-digital converter 320, in the embodiment of a magnetic-field sensor 100 shown in FIG. 8. Depending on the concrete implementation, it may, for example, be advisable in this case to perform band limiting of the signals obtained from the analog-digital converter.

If the sensor 100 is a sensor in which the measurement arrangements 110 are supplied with the aid of a direct-current or direct-voltage signal, corresponding filtering within the framework of the pre-processing circuit 330 may, for example, be done via low-pass filtering. In the case of an excitation of the measurement arrangements 110 with the aid of an alternating-current or alternating-voltage signal, band-pass filtering may also be implemented alternatively or additionally within the framework of the pre-processing circuit 330. Of course, other filter stages, such as a high-pass filter stage, a band suppression stage, a comb filter or another filter stage, may also be implemented. If a corresponding analog-digital converter 320 supplying the pre-processing circuit 330 with digital data is implemented within the framework of an embodiment of a magnetic-field sensor 100, it is of course obvious to provide implementation of digital filter stages within the framework of the corresponding pre-processing circuit 330. If a corresponding analog-digital conversion has not yet taken place up to this point in time within the framework of other embodiments, these may of course also be provided as analog filter stages. Furthermore, within the framework of the pre-processing circuit 330, also further manipulations of the corresponding data and/or signals may of course be made. For example, within the framework of the pre-processing circuit 330, scaling of the signals by multiplication, division or also by a more complex functional description may be performed.

An output of the pre-processing circuit 330 may then be coupled to a processor circuit 340, which, for example, is designed or programmed or constructed so that it controls the multiplexer 310 and/or the pre-processing circuit 330 on the basis of comparison criteria, comparison conditions or other criteria. Moreover, the processor circuit 340, which may, for example, be an ASIC (application specific integrated circuit), may be coupled to a terminal 350 of the magnetic-field sensor 100, at which a corresponding output signal may be provided on the basis of the detected measuring signals of one or measurement arrangements 110 of the magnetic-field sensor 100. Depending on the concrete implementation, this may, for example, be a digital output signal or also an analog output signal. In the case of digital signal processing within the control circuit 120, it may be advisable in such a case to connect a digital/analog converter, which provides the corresponding analog output signal on the basis of digital data provided from the processor circuit 340, between the terminal 350 and the processor circuit 340. Of course, further components, such as amplifier circuits and/or filter stages, may also be connected upstream of the terminal 350.

As will still be explained in the further course of the present application, it may be advisable, depending on the implementation and methods executed within the framework of the control circuit, to supply the multiplexer 310 and/or the pre-processing circuit 330 with a corresponding control signal, for example.

As a further optional component, the control circuit 120 may also include a memory 360, which may, for example, comprise a read-only memory region, a volatile memory region and/or a non-volatile memory region. For example, a program running on the processor circuit 340 or other application-specific or magnetic-field-sensor-specific information may be stored in a read-only memory region, for example. Such a read-only memory region may be a ROM (read-only memory) or also a PROM (programmable read-only memory) memory region. Other read-only memory technologies may of course also be employed in such a case.

A volatile memory region of the memory 360 may, for example, be used to latch data coming up during the execution of a control program on the processor circuit 340 and not being stored within a register of the processor circuit 340. Corresponding memory regions may, for example, be implemented as RAM (random access memory) memories. Finally, information supposed to come out in an undamaged way of a potentially existing voltage interruption of the magnetic-field sensor 100 may be filed in the area of the non-volatile memory regions. For example, information regarding various measurement arrangements 110, their selection or other corresponding information may count among this, as will still be explained in the further course of the present application. A corresponding memory region may, for example, be implemented on the basis of a flash memory architecture.

PROM memory types may also be employed once again within the framework of the non-volatile storage of data and information, if these are supposed to be able to be written into the corresponding memory or memory region only once. For example, if a corresponding calibration method, as it will still be explained in greater detail later, is performed only once and the result of this calibration method is stored only once, it may be filed within the framework of a corresponding PROM memory. Thus, if a corresponding calibration method also is performed only once, so that a result of such a calibration is available to the magnetic-field sensor or its control circuit 120 within the framework of a measuring operation, such information may be filed in a corresponding PROM memory. Depending on the concrete implementation of such a memory, it may, for example, be based on a fuse-like memory technology, in which connections between corresponding nodes may be disconnected or established (on a one-time basis). Writing information and/or determining or storing information therefore also includes establishing and/or disconnecting electrical connections between corresponding nodes within the framework of such a memory, within the framework of the present application. Such a memory technology therefore allows for fixed selection or permanent selection through corresponding programming of such a memory.

The memory technologies enumerated are of course to be understood as merely exemplary. Other memory technologies other than the ones mentioned may certainly be used in the area of the individual memory regions.

As a further optional component, for example, a reference bridge 370 may also be implemented within the framework of the control circuit or sensor circuit 120. A corresponding reference bridge or reference bridge circuit 370 may, for example, consist in ohmic resistors which may be constructed on the basis of metal lines and/or other resistive elements. Examples for this are (optionally highly doped) polysilicon resistive elements. The reference bridge 370, like the measurement arrangements 110, may also be coupled to the multiplexer 310 via a reference bridge tap 380, if required. Furthermore, the reference bridge 370 may also be coupled to the supply circuit 300 via terminals 390a, 390b, so that the excitation signal or a further excitation signal also may be impressed on the corresponding reference bridge 370.

In other embodiments of magnetic-field sensors 100, other implementations may of course be realized as well. Thus, for example, for each signal of the measurement taps 130 of the various measurement arrangements 110, at first a filtering and/or a conversion of the analog measuring signals into digital signals may be performed within the framework of a pre-processing. Here also, in the case of a filtering and an analog-digital conversion, at first a filtering may be implemented in analog manner, only then followed by the analog-digital conversion. Like in the embodiment shown in FIG. 8, of course analog-digital conversion may also be performed first, then followed by, in this case, digital filtering. Independently, in such an embodiment, the optionally digitally converted data stream may be provided to a corresponding multiplexer, which then passes the data concerned on to a processor circuit 340.

Figure 9:
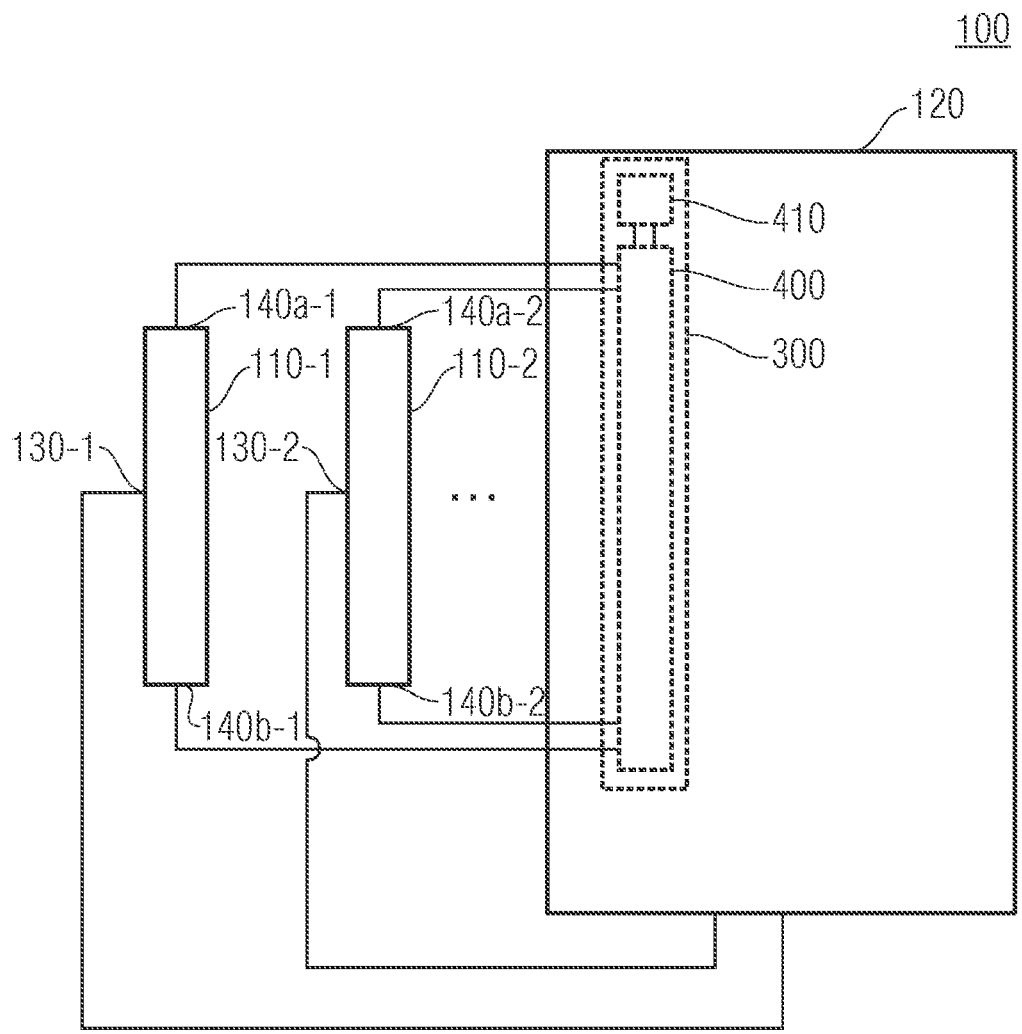
FIG. 9 shows a block circuit diagram of a further embodiment of a magnetic-field sensor.

FIG. 9 shows a further embodiment of a magnetic-field sensor which differs from the embodiment shown in FIG. 8 in terms of the supply circuit 300 in that the supply circuit 300 of the embodiment shown in FIG. 9 now itself comprises a multiplexer 400, which is coupled, with its outputs, to the terminals 140a and 140b of the measurement arrangements 110. The accompanying terminals representing the input of the multiplexer 400 are coupled to a supply circuit 410, which may be a possibly combined alternating-current/alternating-voltage source and/or a direct-current/direct-voltage source just like in the supply circuit 300, depending on the concrete implementation. The supply circuit 410 basically only differs from the supply circuit 300 in that the supply circuit 300 from the embodiment of FIG. 8 is coupled to all terminals 140a, 140b of the measurement arrangements 110, whereas the supply circuit 410 of the embodiment shown in FIG. 9 is only coupled to the multiplexer 400. All other features, properties and implementation variations explained and discussed in connection with the supply circuit shown in FIG. 8 may also be transferred to the supply circuit 410 of the embodiment in FIG. 9. For this reason, reference is made explicitly to the corresponding parts of the description.

With respect to the supply circuits 300 of the two embodiments of a magnetic-field sensor 100 shown in FIGS. 8 and 9, these hence only differ in that basically all measurement arrangements 110 are supplied with a supply voltage or a supply current as excitation signal in the embodiment shown in FIG. 8, whereas there is the possibility of supplying only individual ones, some or all of the measurement arrangements 110 with the excitation signal by employing the multiplexer 400 in the embodiment shown in FIG. 9.

Apart from this, the embodiments shown in FIGS. 8 and 9, as well as the embodiments discussed in connection with FIG. 8, may be combined arbitrarily, wherein it may be advisable, depending on the concrete implementation, to couple the processor circuit 340 shown in FIG. 8 also to the multiplexer 400 such that the processor circuit can also transfer control signals to the multiplexer 400.

Figure 10A:
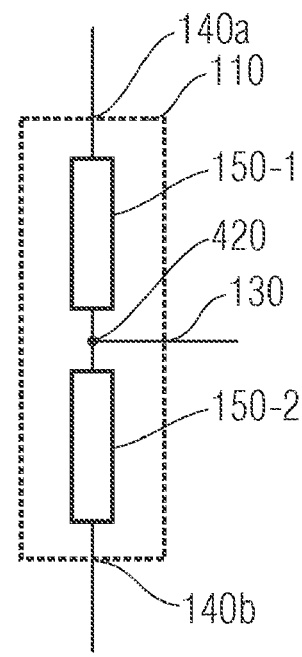
FIG. 10a shows a half-bridge circuit as a measurement arrangement.

FIG. 10a shows an equivalent circuit diagram of a possible realization of a measurement arrangement 110 comprising the two terminals 140a, 140b and the measurement tap 130, as it occurs in connection with the previously explained embodiments of a magnetic-field sensor 100. More specifically, the measurement arrangement illustrated in FIG. 10a includes two sensor elements 150-1, 150-2, which are connected in series between the two terminals 140a and 140b of the measurement arrangement 110 as a half-bridge circuit (or branch of a full-bridge circuit). The measurement tap 130 here is coupled with a point 420, which is arranged between the two sensor elements 150-1, 150-2. The node 420 and/or the measurement tap 130 thus represent a center tap of the half bridge or half-bridge circuit formed by the two sensor elements 150 in FIG. 10a. In this context it also should be pointed out that the circuit illustrated in FIG. 10a represents an equivalent circuit diagram of a measurement arrangement 110, which does not allow for conclusions with respect to the exact spatial positioning of the individual sensor elements 150 in the case of a concrete implementation on a substrate or chip of the magnetic-field sensor 100. As it has been shown in connection with FIG. 2b, the two sensor elements 150-1, 150-2 may be arranged widely apart from each other in space with respect to their extension. Here, the sensor elements 150 may have either nominally identical or partially or completely different resistance values or other characteristics. This does not apply to the measurement arrangement 110 shown in FIG. 10a, but applies to all embodiments of the present invention.

With respect to the individual sensor elements 150, what has already been explained before in connection with other embodiments of a magnetic-field sensor 100, applies. They may, for example, be implemented as magnetoresistive sensor elements, as Hall sensors or other sensor elements. In some embodiments of a magnetic-field sensor 100, it may, for example, be GMR sensor elements.

Figure 10B:
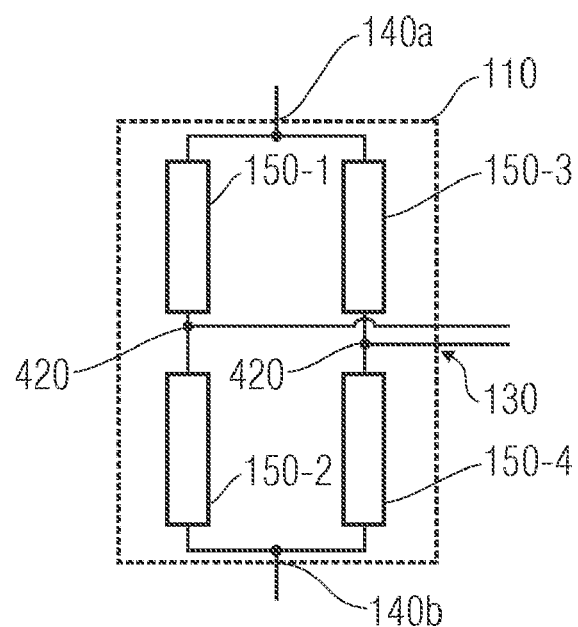
FIG. 10b shows a full-bridge circuit as a measurement arrangement.

While the measurement arrangement 110 depicted in FIG. 10a has shown a half-bridge with two sensor elements 150-1, 150-2, a further alternative implementation of a measurement arrangement 110 is shown in FIG. 10b. More specifically, FIG. 10b thus shows a full-bridge or a full-bridge circuit with four sensor elements 150-1, . . . , 150-4 as measurement arrangement 110. The two sensor elements 150-1, 150-3 here are connected, at one terminal each, to the terminal 140a of the measurement arrangement 110, whereas the two sensor elements 150-2 and 150-4 are coupled, at one terminal each, to the terminal 140b of the measurement arrangement 110. Moreover, the two sensor elements 150-1 and 150-2 are coupled together in series with a half-bridge circuit via a node 420. Correspondingly, the sensor elements 150-3 and 150-4 are also connected in series with a half-bridge circuit via a further node 420. The two half-bridge circuits thus together form a full-bridge circuit, which represents the measurement arrangement 110 in the case shown in FIG. 10b.

Thus, within the framework of the present patent application, a circuit including at least two series-connected sensor elements 150, two series-connected resistive elements or a sensor element with a series-connected resistive element typically is understood by a half-bridge circuit or by a half bridge. A full-bridge circuit or full-bridge correspondingly is a parallel connection of two half-bridge circuits, wherein typically at least one of the two half-bridge circuits includes at least one sensor element 150.

In contrast to the case of a measurement arrangement 110 shown in FIG. 10a, the measurement tap 130 in the present case, however, includes two terminals coupled to the two nodes 420 between the sensor elements 150-1 and 150-2, and 150-3 and 150-4, respectively.

Basically, within the framework of the explanatory embodiments of a magnetic-field sensor 100, various measurement arrangements 110 may thus be employed. Thus, depending on the concrete implementation of an embodiment of a magnetic-field sensor 100, for example, the components shown in FIGS. 1, 8 and 9, which are directly or indirectly coupled to the measurement taps 130, may be formed so that they do not only process, transport, relay or manipulate a single measuring signal, but rather may take a corresponding plurality of measuring signals or measurement lines into account. In the case of a full-bridge circuit, as it is shown in FIG. 10b, implementation of the multiplexer 310 may, for example, be performed so that it couples line pairs to the analog-digital converter 320 shown in FIG. 8.

Moreover, it is to be mentioned that not only sensor elements 150 may be implemented within the framework of the measurement arrangements 110 shown in FIGS. 10a and 10b, but that rather also other circuit elements, such as resistive elements (for example, ohmic resistors of metal and/or polysilicon) may be employed instead of individual sensor elements 150. Thus, instead of one or more of the sensor elements 150 shown in FIG. 10b, resistive elements may, for example, be employed. One possibility, for example, is to exchange one or two of the sensor elements 150-2, 150-4 with corresponding resistive elements.

Furthermore, it is to be pointed out that it also applies to the full-bridge circuit illustrated in FIG. 10b as measurement arrangement 110 that the arrangement of the individual sensor elements 150 illustrated there does not allow any conclusions with respect to an actual arrangement of the sensor elements concerned on a chip or on a substrate. Rather, the two sensor elements 150-1 and 150-4 as well as the two sensor elements 150-2 and 150-3 may, for example, be arranged directly adjacently on a substrate, whereas the two other sensor elements are spaced correspondingly further apart from the sensor elements considered. In other words, for example, in the case of GMR sensor elements, two sensor elements arranged adjacently to each other each may, for example, come to lie at a distance of less than 10 μm on the substrate, while the respective two other sensor elements are arranged at a distance of several hundred μm or mm. Thus, the numeric simulations in FIGS. 3a to 7 were based on distances of 2.5 mm of the two sensor elements. But these are merely exemplary values, which may assume other values depending on the conditions. Thus, the two sensor elements 150-1 and 150-2, and 150-3 and 150-4, respectively, may, for example, also be arranged at any other distances, depending on the topology of an indicator object 190 to be added later, if required.

Figure 10C:
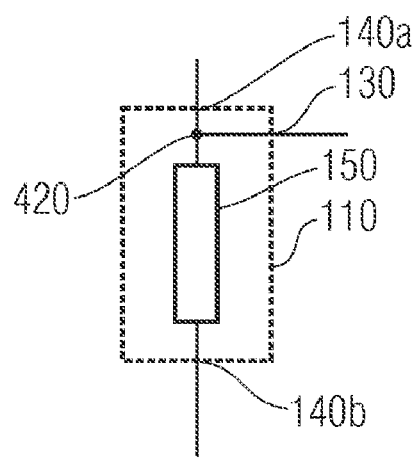
FIG. 10c shows an individual sensor element as a measurement arrangement.

FIG. 10c shows a further embodiment of a measurement arrangement 110, implemented in form of an individual sensor element 150. The sensor element 150 is directly coupled to the two terminals 140a, 140b. The node 420 in this case serves as node at which the measurement tap 130 may be attached. Depending on the concrete implementation, the measurement tap 130 and the terminal 140a coincide (via the node 420). Alternatively or additionally, the corresponding measurement tap 130 may of course also be connected to the terminal 140b via a node.

Figure 10D:
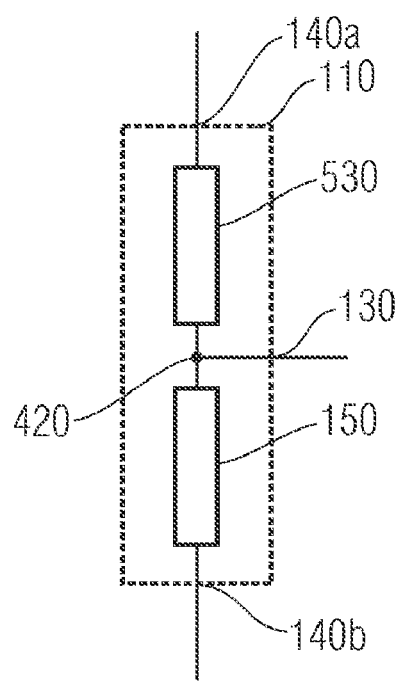
FIG. 10d shows a series connection with a sensor element as a measurement arrangement.

FIG. 10d shows a further possible embodiment of a measurement arrangement 110, which differs from the measurement arrangement 110 shown in FIG. 10a as a half-bridge circuit in that the measurement arrangement 110 in FIG. 10d only has a single sensor element 150 connected between the node 420, the measurement tap 130 and the terminal 140b. Rather, the sensor element 150-1 of the measurement arrangement 110 from FIG. 10a has been replaced by a resistive element 530.

Figure 10E:
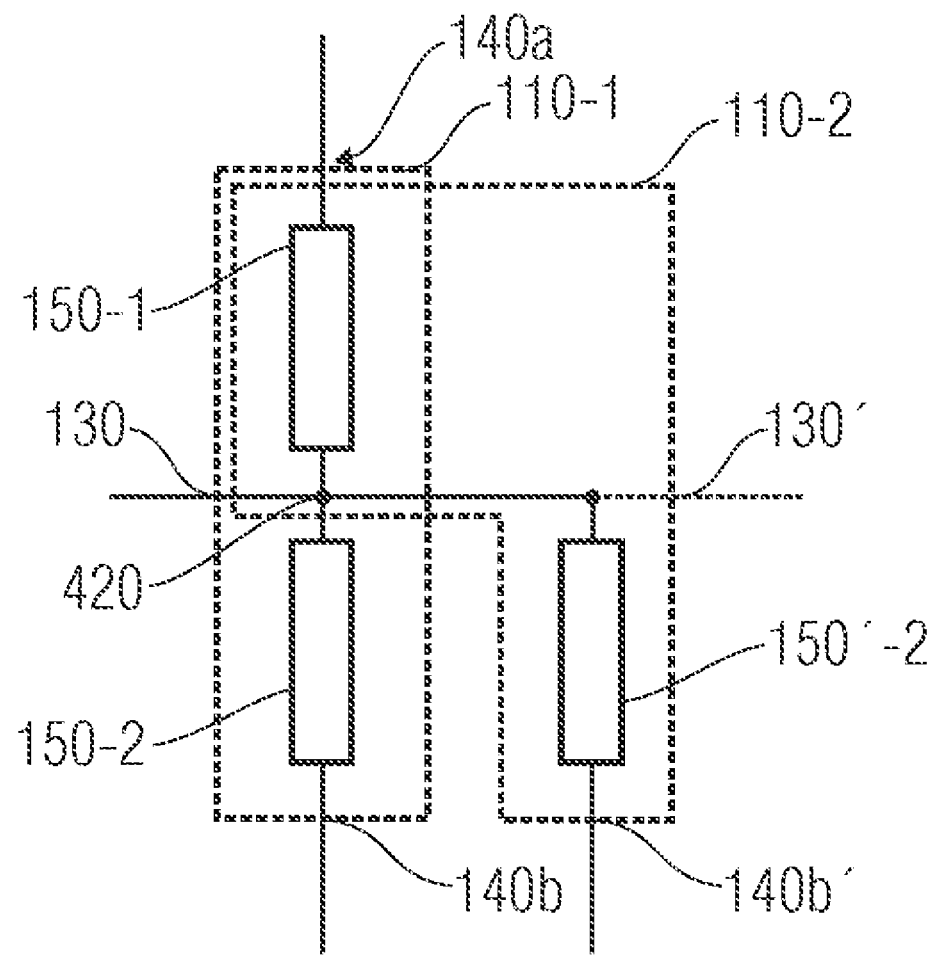
FIG. 10e shows two measurement arrangements with a common sensor element.

FIG. 10e now shows two measurement arrangements 110-1, 110-2, which have a common sensor element 150-1. The common sensor element 150-1 here is coupled to the terminal 140a of both measurement arrangements 110-1, 110-2 as well as the common node 420. Apart from the measurement tap 130 for both measurement arrangements 110-1, 110-2, it further is coupled to two further sensor elements 150-2, 150'-2 each, wherein the sensor element 150-2 belongs to the measurement arrangement 110-1, while the sensor element 150'-2 belongs to the measurement arrangement 110-2. Correspondingly, the respective other terminals of the two sensor elements 150-2, 150'-2 are coupled to the terminals 140b, 140b' belonging to the corresponding measurement arrangements 110-1, 110-2.

The embodiment of two measurement arrangements 110-1, 110-2 shown in FIG. 10e on the one hand thus illustrates that an individual sensor element 150-1 here may not only belong to a single measurement arrangement, but may perfectly well be associated or belonging to several corresponding measurement arrangements. In other words, two or more different measurement arrangements may include a common sensor element 150. Moreover, the embodiment shown in FIG. 10e further illustrates that measurement taps 130 of various measurement arrangements 110 may physically be represented by one and the same line, depending on the concrete implementation. Of course, further optional physical measurement taps 130' may be implemented alternatively and optionally, as this is shown by the dashed illustration of the measurement tap 130' in FIG. 10e. FIG. 10e thus illustrates that a single sensor element may here belong to one or more measurement arrangements, and that measurement taps of various measurement arrangements 110 may be implemented in form of identical and/or physically like measurement lines.

Just like in the previous embodiments, the arrangement of the individual sensor elements 150 illustrated in FIG. 10e does not allow for any conclusions with respect to their actual arrangement on a carrier, substrate or chip. Thus, by selection of various sensor elements 150, for example, by coupling the terminal 140a either to the terminal 140b or to the terminal 140b' in FIG. 10e with the respective supply circuit 300 of the control circuit 120, different measurement points on the substrate concerned can be realized.

Figure 11:
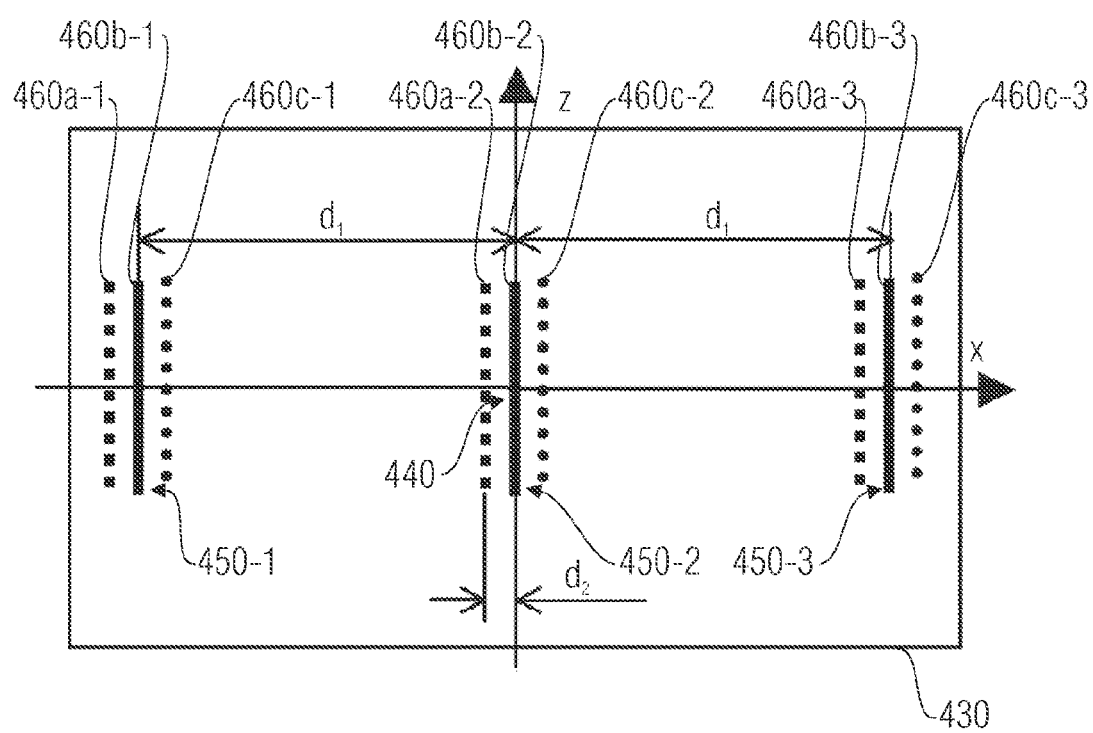
FIG. 11 shows a possible arrangement of measurement arrangements on a substrate or chip.

FIG. 11 schematically shows a top view onto a chip or a substrate 430 in or on which an embodiment of a magnetic-field sensor 100 may be implemented. Starting from a center or central point 440 of the chip 430, a plurality of areas 450 is indicated on the chip 430, wherein the first area 450-1 is spaced from the plurality of areas 430 at a distance $d_1$, starting from the center 440. The center 440 further lies in the second area 450-2, while a third area 450-3 also is arranged at the distance $d_1$ on the side 450-1 facing away from the first area. Within each area 450, in the layout or arrangement plan illustrated in FIG. 11 of an embodiment of a magnetic-field sensor 100, three positions 460a, 460b, 460c each, at which one or more sensor elements 150 may be arranged depending on the concrete implementation, are characterized in FIG. 11. In the layout shown in FIG. 11, the first area 450-1, for example, includes the three positions 460a-1, 460b-1 and 460c-1. Correspondingly, the second area 450-2 and the third area 450-3 also contain three positions 460 each designated in analog manner. Within an area in the layout shown in FIG. 11, the individual positions 460 are arranged at a distance $d_2$, which is typically smaller than the distance $d_1$ of the individual areas 450 among each other, from the respective adjacent position thereof, so that "mixing" of positions of various areas does not occur in the case of many embodiments of magnetic-field sensors 100. In other words, due to the above-explained distance ratios of $d_1$ and $d_2$, the positions 460 of a space area 450 are separated spatially from those of another area 450 in many cases.

As has already been explained in connection with FIG. 2b, for example, in the layout of an embodiment of a magnetic-field sensor 100 shown in FIG. 11, sensor elements 150 (not shown in FIG. 11) connected to form measurement arrangements 110 together with corresponding sensor elements of the third area 450-3 may be arranged in the first area 450-1. On the basis of these sensor elements, as explained, for example, a speed signal v may then be determined by the magnetic-field sensor. In contrast hereto, sensor elements arranged in the second area 450-2, i.e., in the area of the sensor 440 of the chip 430, may be used for providing a direction signal.

Within the framework of embodiments of a magnetic-field sensor 100, it therefore is possible to arrange several, for example, 11, GMR sensor elements or also GMR sensor bridges on the chip 430, wherein these may be offset with respect to each other by the distance $d_2$ each. As explained before, if sensor elements at the positions 460b-1 and 460b-3 of the first area 450-1 and the third area 450-3 are connected to form a measurement arrangement 110 not indicated in FIG. 11, such a sensor bridge has a symmetry center, i.e., its "measurement focus", exactly in the area of the chip sensor 440 at x=0. This bridge may, for example, be provided for the case of assembly that a back-bias magnet is aligned exactly, i.e., without mispositioning, to the center 440 of the chip 430.

Other measurement arrangements may then each be arranged, for example, symmetrically to these positions on the chip 430, i.e., the positions 460b-1 and 460b-3. In FIG. 11, this is exemplarily shown in form of the positions 460a and 460c of the individual areas 450 for an additional bridge or measurement arrangement each. As explained before, if a total of 11 GMR sensor bridges (without the sensor elements of the second area 450-2, if required) are arranged in the manner described on the substrate 430, five sensor bridges are on the right side and five further sensor bridges on the left side, with respect to their respective measurement focuses as compared with the center 440.

As still to be explained further below, after the module assembly, i.e., after the (back-bias) magnet has been glued onto the housing of the later sensor ICs (integrated circuits) or both have been placed into a geometrically defined position with respect to each other by other means, the most favorable measurement arrangement 110 or also sensor bridge may be found and, for example, selected permanently by programming the chip and/or the magnetic-field sensor.

The magnet and the sensor IC may here, for example, be placed into a geometrically defined position with respect to each other by molding, remolding or hot pressing. As most favorable sensor bridge or measurement arrangement, here one may regard the one in which the sensor elements of the individual bridge branches have a smallest magnetic offset possible in terms of magnitude. But other criteria may also be employed, as will be explained in the further course of the present application.

Thus, an embodiment of the sensor arrangement 100 includes several sensors arranged at different positions on the chip, substrate or carrier, so that one of the sensors or also a subset thereof, for example, in the form of a bridge circuit or generally speaking of a measurement arrangement, are selected, which fulfill the measurement task as well as possible, due to their location in the magnetic field of the back-bias magnet. Here, it is not absolutely necessary that these are bridge circuits. Single sensor elements may also be employed as measurement arrangements. Depending on the concrete implementation, the best-located sensor element(s), within the framework of a fixed selection, may be stored, for example, by storing within the framework of a previously explained PROM memory, which is also referred to as WORM (write once read multiple) memory. Such a fixed selection may, for example, be made after the assembly of the sensor arrangement or the sensor and the back-bias magnet within the framework of the so-called module assembly.

With respect to the parameters discussed and explained in connection with FIGS. 3a to 7, for example, a distance $d_1$ of 1.25 mm each and, due to the previously estimated measure of the positional tolerance of 0.21 mm with an overall number of, for example, 11 sensor bridges, a distance $d_2$ of 42 µm is the result in such a case. Thus, the positions 460 of the second area 450-2, for example, are at the x coordinates (x=+/−42 µm, +/−84 µm, +/−126 µm, +/−168 µm and +/−210 µm).

At this point, it is obvious to mention that particularly GMR resistors as sensor elements may be formed to be very narrow and very long. Typical widths often are a few micrometers (<10 µm), while their length often lies in the range of more than 500 µm. If required, it may also be shortened slightly in longitudinal direction by implementation in a meander shape. Hence, regarding the layout, it is comparably easy to realize in terms of technology to arrange the various sensor elements at the positions 460 with an x offset of 42 µm, for example. Furthermore, the GMR resistors may be sputtered onto the silicon wafer after the processing thereof. In particular, the regions below the GMR layers may be used for usual semiconductor circuits or semiconductor devices, i.e., for example, for MOS (metal oxide semiconductor) transistors. For this reason, multiplication of the GMR structures, for example, shown in FIG. 11 does not need any additional chip area. Moreover, in the case of the layout shown in FIG. 11, the resulting GMR sensor may, for example, be magnetically written, premagnetized and/or conditioned by the chip being heated and exposed to a magnetic field simultaneously. In this process step, which may be employed depending on the sensor element technology used, it also is irrelevant whether only a single GMR bridge or several bridges per chip are processed at the same time. Depending on the concrete implementation, for example, also in the case of TMR (tunnel magnetoresistance) sensor elements or other, previously explained sensor element technologies, it may be advisable to perform conditioning. Depending on the concrete implementation of an embodiment of a magnetic-field sensor, these characteristics do indeed have further advantages.

In the layout shown in FIG. 11, a GMR resistor may, for example, be arranged at each of the individual positions 460, as this is schematically illustrated in FIG. 11. For reasons of overview, FIG. 11 here only shows the clearly smaller number of three positions instead of the previously described 11 positions. The GMR resistors as sensor elements may be implemented at the positions 460 illustrated as vertical lines. The coordinate axes, i.e., the x axes and the z axes, are also shown in FIG. 11. The sensor elements and/or GMR resistors implemented at the positions 460b each in FIG. 11 here correspond to that GMR sensor system used in case of an exact positioning of the magnet with respect to the chip 430. The two outer resistor strips or sensor elements at the positions x=+/−1.25 in the case of $d_1=1.25$ mm here are connected to form a half-bridge and form the basis for the speed signal v explained before. The inner resistor strip or inner sensor element in the second area 450-2 at x=0 provides the basis for the direction signal for recognition of the rotation direction of the indicator object.

In the numeric example previously explained, if the magnet is shifted 42 μm to the left along the negative x direction, the positions 460a of the three areas 450 may be chosen and a corresponding sensor system for the later operation may thus be selected. Correspondingly, if the magnet is shifted 42 μm to the right, the sensor elements at the positions 460c of the three areas 450 may be selected to form a corresponding sensor system.

As it has already been explained in connection with FIGS. 10a to 10e, it also is possible to use full-bridge circuits including two half-bridges, instead of half-bridges. This may, for example, also be achieved by the fact that the resistor strips are duplicated or doubled near the positions x=+/−1.25 mm=+/−|$d_1$| and wired as explained in connection with FIG. 2b. In this case, implementation of at least two sensor elements at each position 460a, 460b, 460c is possible at least in the first area 450-1 and in the third area 450-3. Depending on the concrete implementation and shape of the sensor elements used, not least dependent on the sensor element technology utilized, the respective sensor elements of a position, i.e., for example, the position 460a-1, can be arranged by a horizontal shift along the x direction, a vertical shift along the z direction or by a combined shift along the x and z directions.

As an extension of the above-described concept, it is to be noted that the rigid coupling of the individual positions 460a, 460b, 460c, as, for example, illustrated schematically in FIG. 11, i.e., the rigid coupling of the GMR bridge parts, may also be eliminated. In this case, it may be possible for a module manufacturer to choose the distance between the direction sensor elements, i.e., the sensor elements used for direction signal generation, and the speed sensor elements, i.e., the sensor elements used for the determination and output of the speed signal, independently of the distances $d_1$. In case of an implementation with $d_1=1.25$ mm, for example, a distance of 1208 μm may be achieved by using a sensor element at the position 460c-1 as left GMR resistor or other sensor element, one at the position 460b-2 as central sensor element and a sensor element at the position 460a-3 as right sensor element. If 11 GMR resistors or sensor elements are arranged in a manner offset by 42 μm each with respect to each other and are selectable arbitrarily, according to the above explanations, the distance $d_1$, which is also referred to as pitch, may be varied between 1.04 and 1.46 mm. Hereby, it may be possible to better adapt an embodiment of a magnetic-field sensor to different toothed wheels. If required, also in magnetic systems inherently producing a smaller magnetic offset, a larger pitch distance and hence also greater magnetic sensitivity may be achieved thereby. Depending on the concrete implementation, such decoupling may, however, lead to lower calibration capability of an embodiment of a magnetic-field sensor, which may, for example, be compensated for by an increase in the number of positions 460 and/or the accompanying sensor elements, if required.

A design or layout, as shown in FIG. 11, thus may lead to the fact that an assembly tolerance or tolerance in fabrication of the overall system between magnet and the chip 430 may, in some embodiments of a magnetic-field sensor 100, be balanced by selecting, from several measuring bridges shifted with respect to each other, for example, in the form of xMR systems, the one which is centered in the best way with respect to the magnet.

In the following, apart from a further embodiment of a magnetic-field sensor 100, various methods in which an adjustment of the sensor to the magnetic field in the application, i.e., in the interplay with the back-bias magnet and the toothed wheel, takes place are described. For magnetoresistive sensors in particular, this often represents a problem not to be underestimated due to the previously described difficulties and properties of magnetoresistive sensors.

Here, in many embodiments of magnetic-field sensors, half bridges are provided as measurement arrangements, which may be connected to a read-out circuit or sensor circuit or control circuit in different configurations, so that measurement arrangements or bridges which can be shifted in an x direction can be produced. Corresponding bridge arrangements may be realized both as one-dimensional arrangements and as two-dimensional arrangements, as may, for example, be used for an incremental speed sensor arrangement. However, before explaining various methods for self-adjustment of a sensor in a magnetic circuit, which allow for compensation of a positional tolerance, at first a further embodiment of a magnetic-field sensor 100 will be described in connection with FIG. 12.

Figure 12:
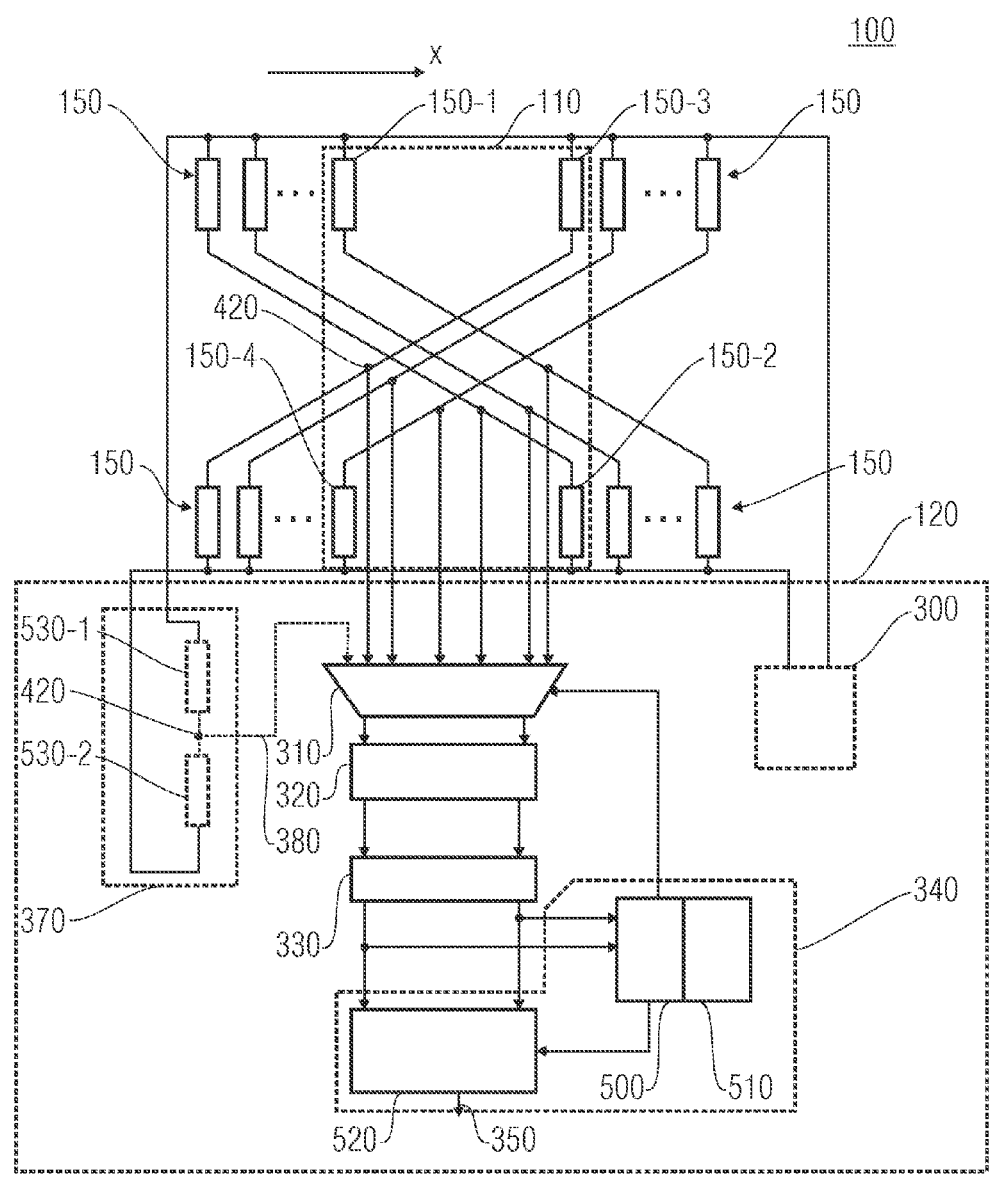
FIG. 12 shows a further embodiment of a magnetic-field sensor.

Thus, FIG. 12 shows a further embodiment of a magnetic-field sensor 100 with a plurality of measurement bridges, which include full-bridge circuits of four sensor elements 150-1, 150-2, 150-3, 150-4 each, in the embodiment of a magnetic-field sensor 100 shown in FIG. 12. In contrast to the illustrations of FIG. 10, the sensor elements 150 in FIG. 12 are shown here, at least regarding the x direction depicted in FIG. 12, with respect to their arrangement. Moreover, only a single measurement arrangement 110 is characterized as such for reasons of simplicity in FIG. 12. The other sensor elements 150 also form further measurement arrangements 110, as shown by the connections.

Here, each of the sensor elements 150 is directly coupled to a terminal of a supply circuit 300. More specifically, the sensor elements 150-1, 150-3 of the measurement arrangement 110 are connected to a first terminal of the supply circuit 300, which, for example, supplies the measurement arrangement with a positive supply voltage Vbridge+. The sensor elements 150-2 and 150-4 of the measurement arrangement 110 are coupled to a second terminal of the supply circuit 300, which supplies the sensor elements concerned with a further or negative supply voltage or supply potential Vbridge−, which often is a reference potential, i.e., ground (GND), for example.

A node 420 is again connected between the sensor elements 150-1 and 150-2, and 150-3 and 150-4, respectively, which together represent the measurement tap 130 (not shown in FIG. 12) of the measurement arrangement 110. The measurement taps of all sensor bridges are coupled, within the framework of the sensor circuit or control circuit 120, to a multiplexer 310, which is coupled to an analog-digital converter 320 (ADC) via an output. As shown before in connection with FIG. 8, an output of the analog-digital converter 320 is coupled to a pre-processing circuit 330, which again comprises filter elements or other (digital) signal manipulation circuits. An output of the pre-processing circuit 330 then is coupled to a processor circuit 340, which comprises, depending on the concrete implementation of an embodiment of a magnetic-field sensor 100, for example, a minimum/maximum detector (min/max detection) 500, which again is coupled to a bridge selector 510, which may provide control signals to the multiplexer 310. Moreover, the output of the pre-processing circuit 330 is coupled to a further processing circuit 520 which may perform further incremental speed sensor data processing within the framework of the processing circuit 340. It may provide a corresponding output signal (out) at a terminal 350. A corresponding minimum/maximum detector 500, which is also referred to as maximum/minimum detector 500, may, for example, be formed so that it calculates a derivation and/or an alteration on the basis of one or more further measuring signals, which were registered before. If this is within a predetermined value range in terms of magnitude, i.e., for example, below 10%, 5% or 1% of a maximum slope occurring, this may be rated as a presence of a maximum. Of course, other criteria may also be implemented within the framework of a maximum/minimum detector 500. Thus, for example, on the basis of the (absolute) values of the signals concerned, it may be decided whether these are within a predetermined range around the extreme values. If a corresponding measuring value is detected, this is interpreted as the presence of a maximum.

Moreover, the embodiment of a magnetic-field sensor 100 shown in FIG. 12 comprises a reference bridge 370, which may, for example, be implemented as a voltage splitter on the basis of two resistive elements 530-1 and 530-2 with a corresponding node 420. The resistive elements 530, just like the sensor elements 150, are coupled to the above-mentioned terminals of the supply circuit 300, i.e., the corresponding voltages and potentials. The node 420 of the reference bridge 370 again represents a reference bridge tap 380 also coupled to the multiplexer 310 on the input side in this embodiment. The resistive elements 530 represent a non-sensitive reference, in contrast to the sensor elements 150, which may, for example, be fabricated in the form of ohmic resistive elements of metal traces or optionally highly doped polysilicon resistive elements.

As already explained in connection with the embodiments of FIGS. 1, 8 and 9, the control circuit 120 may generate one or more measuring signals, which can be detected and processed further by the control circuit 120, at the measurement taps by supplying the measurement arrangements 110 with an excitation signal.

The methods of performing self-calibration described in the following, in many embodiments start with simultaneously or sequentially detecting measuring signals of all measurement arrangements, of some measurement arrangements or of individual measurement arrangements. From the determined waveform of the bridges, then the measurement arrangements or the measurement arrangement 110 having the most favorable position for the actual measurements are determined. Here, within the framework of embodiments of various methods for the decision, various embodiments of corresponding methods of calibrating a magnetic-field sensor 100 will be illustrated and explained in the further course of the present application.

Figure 13:
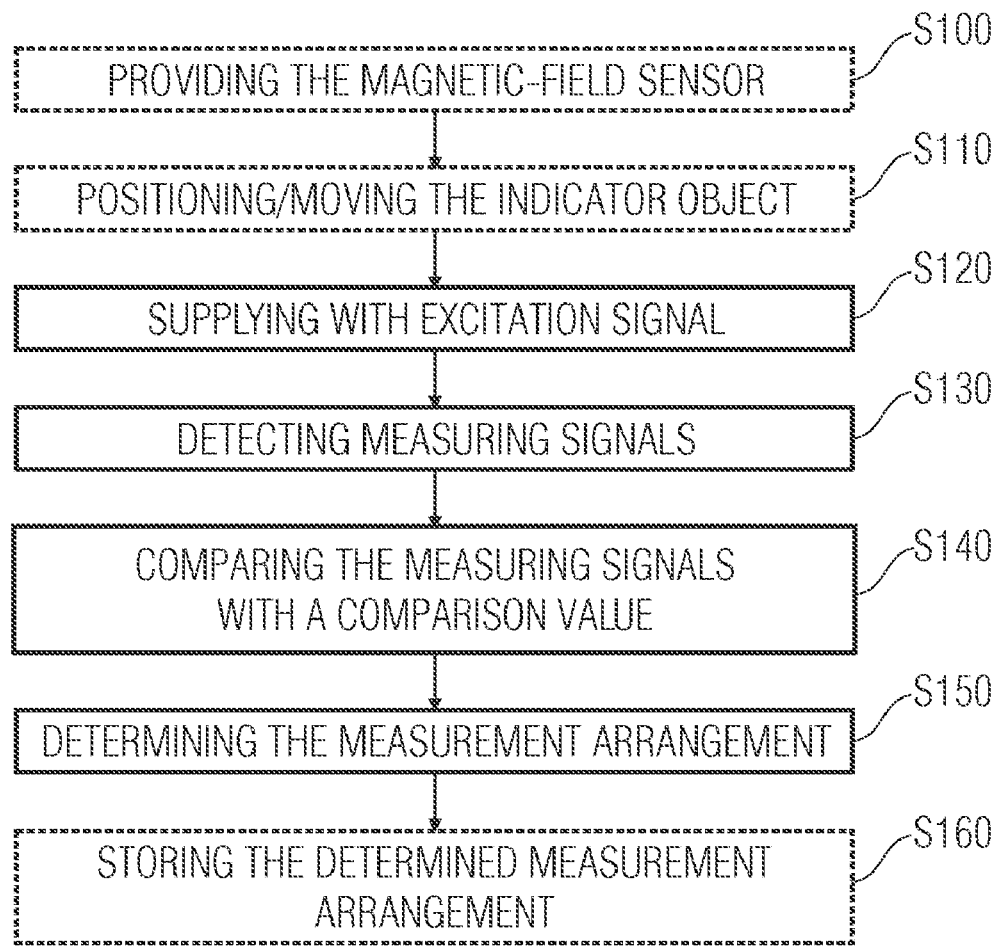
FIG. 13 shows a flow chart of an embodiment of a method of calibrating a magnetic-field sensor.

FIG. 13 shows a flow chart of a first embodiment of a method of self-calibration of the previously described embodiments of magnetic-field sensors 100, which maybe represents one of the simpler methods. The method consists in (as a sub-step) the sensor, after the assembly with the magnet or back-bias magnet, being put into operation in an environment in which the magnetic fields are not distorted by ferromagnetic parts. In this state, the sensor bridge, ideally in the case of a full-bridge circuit, should provide an infinitesimal output signal, as far the measurement arrangements 110 are formed to be symmetrical. In the case of half-bridges or half-bridge circuits as measurement arrangements 110, the output signals ideally should provide 50% of the excitation voltage in the case of a voltage supply as excitation signal. One of these two criteria may then be tested in a test mode. The bridge of the measurement arrangements 110 coming closest to the ideal result then is fixedly selected for later operation, for example, wherein the selection is fixed by means of a non-volatile memory, i.e., for example, an EEPROM (electronically erasable programmable read-only memory).

One embodiment of a method of calibrating a magnetic-field sensor 100 thus optionally begins with a step S100 of providing a magnetic-field sensor 100, as also illustrated in FIG. 13, within the framework of the flow chart shown there. This may, for example, be performed within the framework of the manufacturing method of a corresponding magnetic-field sensor 100 within the framework of a control of corresponding production equipment by a computer program or another device. Within the framework of a further optional step S110 of positioning and/or moving an indicator object, which, for example, does not necessarily have to be performed within the framework of the previously described embodiment of the method of calibrating the magnetic-field sensor 100, further adjustment of the magnetic flux may be performed if the magnetic-field sensor 100 is indeed to be calibrated in the environment and/or in the range of influence of an indicator object.

In a step S120, which may, for example, be initiated by the control circuit 120, the measurement arrangements are supplied with an excitation signal, so that a tappable measuring signal is generated at each measurement tap of the measurement arrangements concerned. As explained before, depending on the concrete implementation of a corresponding embodiment of a magnetic-field sensor 100, the excitation signal may be a current signal and/or a voltage signal in which direct-current or direct-voltage components and/or alternating-current/alternating-voltage components are present.

Then, in a step S130, the measuring signals provided from the measurement arrangements 110 are detected. Depending on the concrete implementation of the embodiment of the method described in FIG. 13, this may, for example, be done by one-time or multiple detection of the measuring signals of the measurement arrangements 110 concerned, according to an order of the measurement bridges, which is also referred to as a measurement sequence or sequence. If several measuring values or measuring signals are detected here, for example averaging may be performed.

In a step S140 of comparing the measuring signals with a comparison value, depending on the concrete implementation of an embodiment of the corresponding method, for example, a difference value of the measuring signal with a comparison value may be determined. Alternatively or additionally, a magnitude or absolute difference value also may be determined in this comparison of the measuring signals with a comparison value. Of course, other, i.e., possibly square difference values may also be determined. Moreover, within the framework of the method step S140, other mathematical or functional connections may also be used, for example, in a calculation of a corresponding difference value.

In a method step S150, the measurement arrangement which seems optimal on the basis of the comparison performed in the method step S140 then is determined. This may, for example, be done, depending on the concrete implementation of an embodiment, by selecting the measurement arrangement 110 having the smallest difference value in terms of magnitude with respect to the measuring signal and the comparison value. Of course, other criteria may also be used within the framework of the determination of the best measurement arrangement 110 and/or the corresponding measurement arrangement 110.

Within the framework of the steps S140 and S150, as explained before, for example, in the case of a voltage signal as excitation signal, 50% of the voltage value of the excitation signal may be used as comparison value in the case of a half-bridge circuit as measurement arrangement 110. In the case of a full-bridge circuit as measurement arrangement 110 or when using a reference arrangement, there also is the possibility of defining a disappearance of the measuring signal, i.e., a comparison value of zero, as comparison value. Of course, any other comparison values which make sense depending on the corresponding implementation may be used. For example, if the excitation signal is an alternating voltage signal, there also are the possibilities of employing the respective momentary values, the maximum values, the minimum values or other amplitudes or effective values within the framework of the method steps S140 and S150. In the case of a current signal as an excitation signal, corresponding current or voltage values may of course also be employed within the framework of corresponding measurement bridge implementations. In a method step S160, then the determined measurement arrangement may optionally be stored or filed within the framework of a non-volatile memory or another, write-once only memory, for example.

In the case of an embodiment of the method of calibrating a magnetic-field sensor 100 in an environment in which the fields of the back-bias magnet are not distorted by ferromagnetic parts, such as the indicator object, as described in FIG. 13, there may exist the disadvantageous effect that, although the position of the magnetic-field sensor 100 with respect to its back-bias magnet 160 is compensated for in the best way possible, influences of the later employment in the application, i.e., tilting of the magnetic-field sensor 100 with respect to the toothed wheel acting as indicator object 190, remain disregarded, however. Depending on the concrete implementation, it may therefore be advisable to perform an embodiment of a corresponding method within the framework of a system start so as to perform calibration of the magnetic-field sensor within the framework of the later field of application.

An embodiment of the above-explained method may of course also be performed in the case of a built-in magnetic-field sensor. For example, the embodiments illustrated in FIG. 13 may be provided in the case of an automobile application, if the magnetic-field sensor is indeed already supplied with current or energy, but rotation of the indicator object and/or the object (shaft, gear-shaft, crankshaft, wheel, camshaft, etc.) connected to the indicator object does not yet take place. In such a case, the optional step S100 of providing the magnetic-field sensor may of course be omitted. In such an embodiment, however, it may be of advantage to position and/or move the indicator object within the framework of the optional step S110.

Hence, there is the possibility of bringing the indicator object (e.g., toothed wheel) into a defined angular position and then measuring the bridge output signals as measuring signals and/or separately detecting the individual signals of the bridge branches. Thus, the toothed wheel as an indicator object could, for example, be brought into a position exactly between "tooth" and "gap". In other words, in the case of a toothed wheel as an indicator object, it could be positioned so that a position lies as exactly as possible between a state in which a tooth is directly below the chip center 440 (from FIG. 11) and the state in which a tooth gap is directly below the chip center 440. In many cases, the magnetic field in this position is comparable, in very good approximation, with the above-explained magnetic offset. If required, the magnetic field may even be identical with the previously defined magnetic offset in this position. As explained before, this magnetic offset should be as close to zero as possible. Hence, as the most favorably located measurement arrangement or also sensor bridge, one should select the one whose individual measuring signals or bridge signals lie as closely as possible to the zero crossing, i.e., disappear. In the case of a half-bridge circuit, the previously explained comparison value of about 50% of the excitation voltage of the excitation signal may be used alternatively or additionally. Such a positioning or movement of the indicator object may be realized by driving the shaft concerned, if required, as far as this is possible within the framework of the implementation of the overall system.

As an alternative, there also is the possibility to rotate the indicator object, i.e., e.g., the toothed wheel, over one or more periods, i.e., through a rotation angle of several tooth distances, and form the mean value in the course thereof. This resulting measuring signal may then also be identified with the magnetic offset. Once again, that bridge whose mean value lies as closely as possible to zero in the case of a full-bridge circuit as measurement arrangement 110 is selected. If the toothed wheel is moved continuously, i.e., for example, rotated at a continuous angular speed, measuring signals may be faded out immediately around a possibly existing reference mark, i.e., for example, an index tooth or an index gap, since these may corrupt the mean value formation. This may, for example, be realized by resetting a corresponding integrator if a corresponding evaluation circuit identifies the reference mark, for example, in form of a twice-as-long signal. It may possibly be advisable to wait for a period of time dependent on the exact implementation and specification of the overall system prior to a corresponding measuring value detection after the recognition of the index mark, so that the index mark has the chance to move away from the magnetic-field sensor 100, in order to inhibit further disturbances thereby.

Within the framework of the latter method in particular, movements of the indicator object may be initiated, for example, within the framework of the step S110. Moreover, within the framework of the step S130 of detecting measuring signals, a corresponding detection of a multitude of measuring signals of an individual measurement arrangement may be performed before another measurement arrangement is activated or switched on. Within the framework of the comparison of the measuring signals with a comparison value in method step S140, for example, a sum value or a mean value may then be utilized within the framework of the comparison.

Depending on the concrete implementation of a method of calibrating a magnetic-field sensor, as it is shown in FIG. 13, the method step S130 of detecting measuring signals may thus include switching through the measurement arrangements and detecting one or more measuring signals for each of the switched-through measurement arrangements, or also successively switching through the measurement arrangement, wherein a continuous detection of measuring signals is performed for the measurement arrangement selected each, wherein the measuring signals should be taken into account in measurement-bridge-specific manner in this case, within the framework of the method step S140.

A further alternative to a quick selection of a bridge on the basis of the method of calibrating a magnetic-field sensor described in FIG. 13 is to detect the half-bridge voltage as opposed to a reference or as opposed to a reference signal for example of the reference measurement arrangement 370, which are present at the reference tap 380, in the case of half-bridge circuits as measurement arrangements. In this manner, it is possible to measure common-mode signals (common-mode portions) of the bridge signals in order to select the bridge best centered onto the back-bias magnet and/or the indicator object and thus supposed to be in the best one of the working points available.

Especially the latter criterion thus has the advantage, depending on the embodiment and the example of application, of not having to wait for a pair of successive extreme values (minimum/maximum), but may possibly have the disadvantage that the bridge or measurement arrangement providing the largest swing and therefore possibly the best signal is not determined directly. An embodiment of this method rather only allows for indirectly drawing conclusions as to whether a measurement arrangement is well centered with respect to the field, i.e., is in a favorable measurement position. Depending on the concrete implementation, this may well depend on the magnetic circuit, so that corresponding verification of the above-mentioned criterion could possibly be performed for individual, some or all of the magnetic-circuit arrangements in the entire parameter space of positioning errors in some embodiments.

In other words, the measuring signals can be detected with respect to a reference signal of a reference measurement arrangement (e.g., reference bridge) 370 in embodiments within the framework of the method step S130 of detecting measuring signals. Hereby, it is possible to use, for example, a comparison value of zero also in the case of half-bridge circuits, which could possibly bring along further advantages within the framework of the implementation of the control circuit and/or the sensor circuit 120, since the quantization range of the analog-digital converter 320, if implemented, may possibly be optimized for smaller signal swings, if required. Of course, there also is the possibility of taking a corresponding comparison value into account also within the framework of the step S140 and/or within the framework of the step S150. In such a case, for example, within the framework of the step S140, the reference signal of the reference measurement arrangement could be taken into account numerically. Likewise, a measuring signal of the reference measurement arrangement 370 could be used as comparison value within the framework of the steps S140 or S150.

Figure 14:
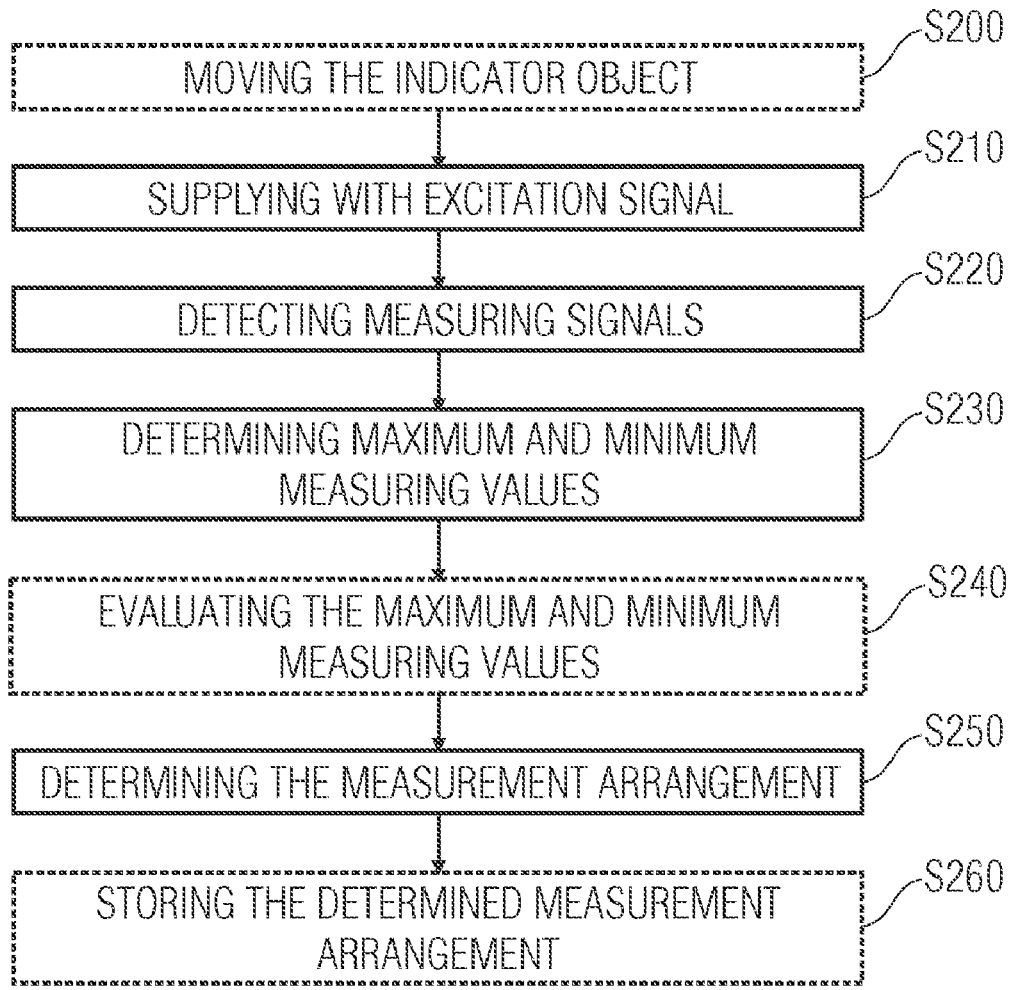
FIG. 14 shows a flow chart of a further embodiment of a method of calibrating a magnetic-field sensor.

A further embodiment of a method of calibrating a magnetic-field sensor 100 is illustrated in form of a flow chart in FIG. 14. Within the framework of an optional method step S200, an indicator object may be moved, if required, so that it can provide measuring signals including more than one period. Of course, depending on the concrete implementation and application of an embodiment of a corresponding magnetic-field sensor 100, the optional step S200 of moving the indicator object may be performed implicitly, for example, if the method basically only is performed when the respective indicator object or the component connected to the indicator object rotates or moves.

Within the framework of a step S210, one, several or all measurement arrangements are then once again supplied with an excitation signal, so that a corresponding measuring signal can be tapped at each measurement tap of the measurement arrangements. Within the framework of a method step S220 of detecting measuring signals, the measuring signals of one or more measurement arrangements then each are detected cyclically or for a certain time interval, so that a maximum and a minimum measuring value is determined or can be determined for each of the respective measurement arrangements within the framework of a method step S230 of determining maximum and minimum measuring values. Within the framework of an optional method step S240, the maximum and minimum measuring values thus determined may be evaluated in that a difference of the maximum and minimum measuring values of each measurement arrangement is determined, so that information with respect to the swing of the measuring signals or their amplitudes exists. Within the framework of a step S250 of determining the measurement arrangement, the measurement arrangement, for example, having the greatest difference of the respective maximum and minimum measuring values, i.e., for example, the maximum swing or also the maximum amplitude of the measuring values, may then be determined. Information of the determined or selected measurement arrangement may then again be filed in a corresponding memory, i.e., for example, in a non-volatile memory or a write-once memory, in an optional method step S260, if required.

Depending on the concrete implementation of the embodiment of a method illustrated in FIG. 14, the step S220 of detecting the measuring signals, determining the maximum and minimum measuring values in step S230, and the optional step S240 of evaluating the maximum and minimum measuring values individually for each measurement arrangement thus may be performed sequentially for each measurement arrangement here, so that the two or possibly three method steps S220, S230, S240 are performed separately for each of the measurement arrangements. Alternatively or maybe also additionally, in the case of a connection in the form of groups of measurement arrangements, with each one including several measurement arrangements, but not all corresponding measurement bridges, the steps S220, S230 and maybe S240 each may be performed so that a first a measuring value or measuring signal of a measurement arrangement is detected, and it is checked whether this measuring value represents a maximum or minimum measuring value, wherein preceding measuring values or measuring signals of the respective measurement arrangement are taken into account, if required, before switching to the next measurement arrangement and again performing at least the steps S220 and S230 for the same.

The embodiment of a method of self-calibration and/or of calibrating a magnetic-field sensor 100 illustrated in FIG. 14 may, in operation, also be implemented on the basis of the embodiment of a magnetic-field sensor illustrated in FIG. 12, for example. If a corresponding magnetic-field sensor, for example, includes three spatially offset sensor bridges or measurement bridges, these are multiplexed in sequence via the multiplexer 310 and digitized via the analog-digital converter 320 upon the start of the system. Thereupon, preprocessing within the framework of the pre-processing circuit 330, i.e., for example, band limitation, may take place. For each of the signals, then minima and maxima can be determined, which can be achieved within the framework of the embodiment shown in FIG. 12, by the minimum/maximum detector 500 of the processor circuit 340.

Corresponding detection of the minima and/or maxima may, for example, take place by comparing the detected measuring values or measuring signals each of the individual measurement arrangements with the previously detected measuring signals or measuring values, so that, for example, a kind of differential and/or difference-based signal evaluation may be performed within the framework of the maximum/minimum detection 500. Alternatively or additionally, of course a correspondingly large memory or register can be implemented within the framework of the maximum/minimum detection 500, so that at least so many measuring values or measuring signals can be captured or latched in bridge-specific manner that at least a complete period of measuring signals with respect to the periodic change of the magnetic field detected by the magnetic-field sensor and caused by the indicator object is recorded. In this case, simply by a numerical comparison of the recorded measuring values, the respective maximum and minimum measuring value for each measurement arrangement can be determined, so that the corresponding information regarding the swing or also the amplitude or also other corresponding characteristic quantities can be made available by the maximum/minimum detection 500.

Here, within the framework of the method step S220 and/or within the framework of the method step S230, at least so many measuring values can be detected and sensed for each measurement arrangement such that the minimum/maximum detection 500 is capable of performing the determination of the maximum and of the minimum on the basis of measuring values of a complete period of the periodically changing magnetic field caused by the indicator object, or that each of the bridges is switched through sequentially by the multiplexer 310 by the bridge selection circuit 510, so that between a change of the measurement arrangements a single or a few measuring signals or measuring values are detected and processed further each over one or more periods of the magnetic field. Depending on the existing boundary conditions, for example depending on the sampling frequency available within the framework of the analog-digital conversion, depending on the necessary speed for performing the calibration method, the one or the other procedure outlined within the framework of embodiments of the method of calibrating a magnetic-field sensor 100 or also mixed forms of the two can be performed on the basis of groups of measurement arrangements, for example.

The actual bridge selection is then made such that the measurement arrangement with the greatest signal swing is selected. The minima and maxima may at the same time be employed in the further signal processing, such as to determine switching thresholds for the edge recognition or other method steps. In other words, the data acquired within the framework of the embodiment of the method of calibrating a magnetic-field sensor may also be used within the framework of the further operation of the magnetic-field sensor, i.e., within the framework of the processing circuit 520. In connection with the pre-processing circuit 330 it may be advisable, depending on the concrete implementation, to implement parallel filter paths within the framework of possibly implemented filter stages, for the various sensor bridges, in order to prevent mixing of measuring signals of various measurement arrangements or sensor bridges. In other words, this may, for example, be done, in the case of quick through-switching of the individual measurement arrangement, wherein only one or a few measuring values are detected each, by transferring these into stand-alone latches or stand-alone filter stages each within the framework of the pre-processing circuit 330.

Within the framework of the embodiment of the method of calibrating the magnetic-field sensor 100 illustrated in FIG. 14, at least a complete period in form of corresponding measuring signals or measuring signal courses can be detected either for each measurement arrangement individually within the framework of the step S220, only then followed by switching the respective measurement arrangement over and repeating the detection of the corresponding measuring signals. Alternatively or additionally, during one or more periods of the changing magnetic field, quick switching of the individual measurement arrangements may also take place, so that only a one or a few measuring signals of a measurement arrangement each are detected. While analog-digital conversion may take place at a comparably low sampling rate within the framework of the first implementation variant, the second variant calls for correspondingly quicker analog-digital conversion with respect to the sampling rate. On the other hand, especially due to the quicker analog-digital conversion of the second variant, this allows for quicker execution of the overall method of calibrating the magnetic-field sensor 100.

Figure 15A:
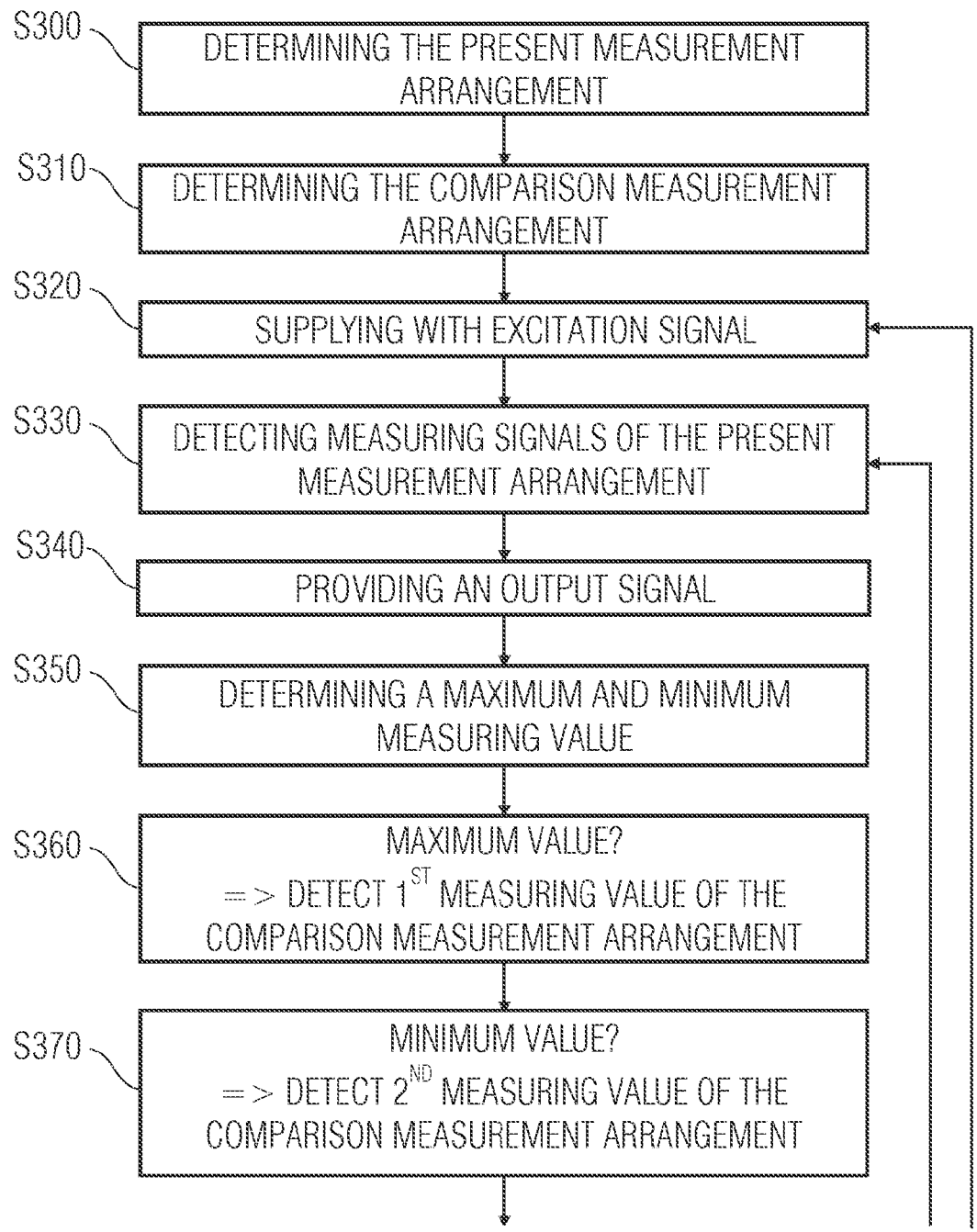
FIGS. 15a and 15b show a flow chart of a further embodiment of a method of calibrating a magnetic-field sensor.
Figure 15B:
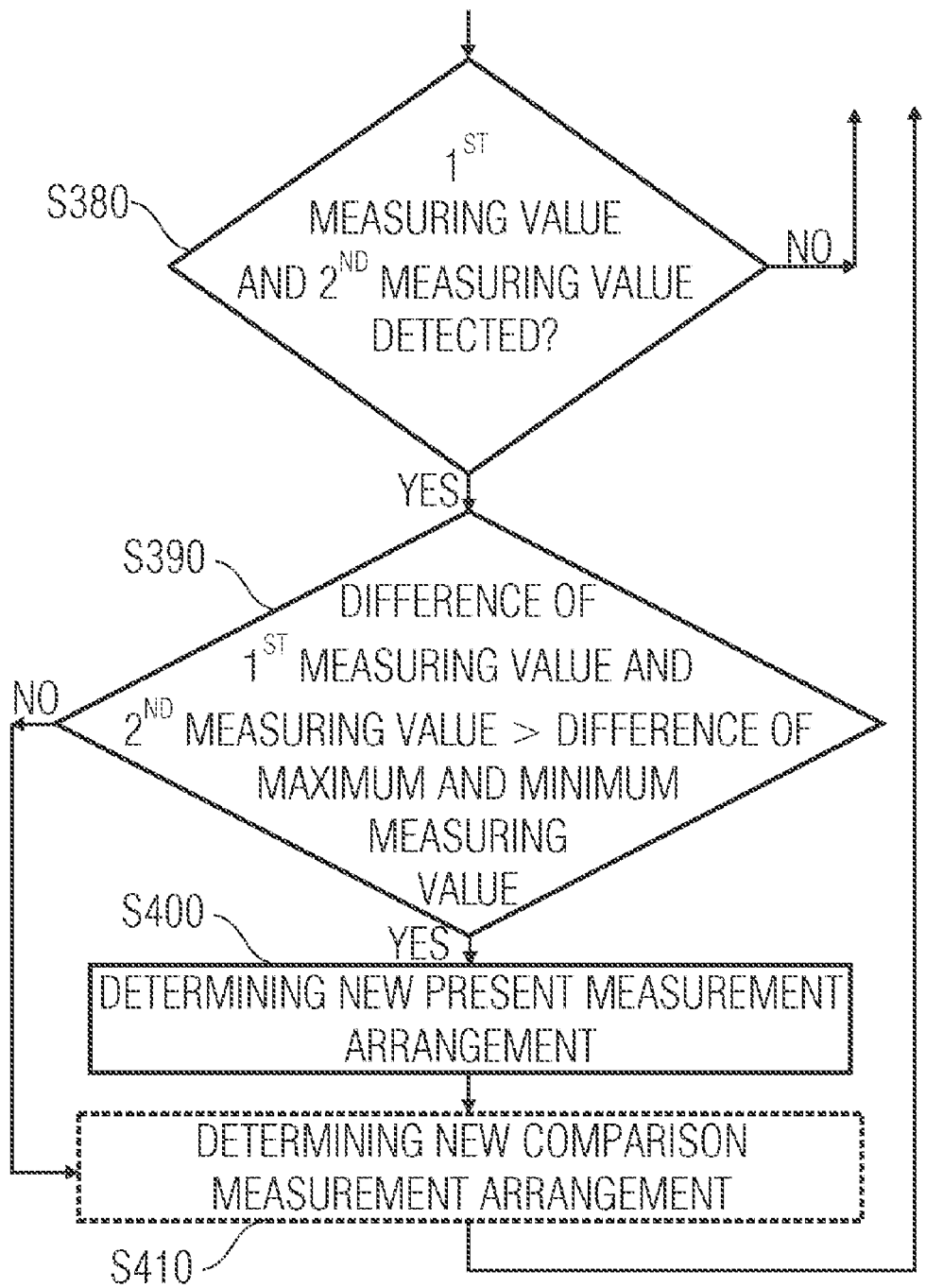

FIGS. 15a and 15b together show a flow chart of a further embodiment of a method of calibrating a magnetic-field sensor 100, which again comprises a plurality of sensor elements connected to form measurement bridges, wherein each measurement bridge comprises a measurement tap, and wherein the magnetic-field sensor is exposed to a magnetic field periodically changing in time. As explained before, corresponding magnetic field periodically changing in time may be caused by rotating indicator objects.

Within the framework of the embodiment of the method of calibrating a magnetic-field sensor illustrated in FIGS. 15a and 15b, at first a present measurement arrangement of the plurality of measurement arrangements is determined within the framework of a method step S300. Moreover, within the framework of the step S310, a comparison bridge, which is not the present measurement arrangement, is determined, and these two measurement bridges, i.e., the present measurement arrangement and the comparison measurement bridge, are supplied with an excitation signal in a step S320. Within the framework of the step S330, then measuring signals of the present measurement arrangement are detected and processed to form an output signal, which may, for example, be provided at the terminal 350 of the magnetic-field sensor, by the processor circuit 340 within the framework of a step S340 after an optional analog-digital conversion and/or a possibly performed pre-processing within the framework of the pre-processing circuit 330.

Within the framework of a step S350, here also the maximum and/or minimum measuring values of the present measurement arrangement are determined. If a maximum value is recognized within the framework of the step S360, the multiplexer 310 switches to the comparison measurement arrangement, and a first measuring value of the comparison measurement arrangement is detected. Then the multiplexer 310 again switches to the present measurement arrangement, if required.

If a minimum value of the present measurement arrangement is recognized within the framework of a method step S370, the multiplexer 310 switches to the comparison measurement arrangement in an analog manner, a second measuring value of the comparison measurement arrangement is detected, and the multiplexer 310 again switches back to the present measurement arrangement, if required. If it is recognized, within the framework of the step S380, that both a first and a second measuring value with respect to the comparison measurement arrangement have been detected, a difference of the first measuring value and the second measuring value and a difference of the maximum and minimum measuring values of the present measurement arrangement are compared and related to each other within the framework of the step S390. However, if it has been recognized, within the framework of the step S380, that the first measuring value and the second measuring value of the comparison measurement arrangement have not been detected, the embodiment of the method is continued with the detection of the measuring signals within the framework of the step S330.

If it is once again determined, within the framework of the method step S390, that the difference of the first measuring value and the second measuring value is greater than the difference of the maximum and the minimum measuring value of the present measurement arrangement, the comparison measurement arrangement is determined as the new measurement arrangement within the framework of a method step S400. In an optional method step S410, a new comparison measurement arrangement may then be determined, if required, and supplied with an excitation signal within the framework of a return to the step S320, if required, as far as this is necessary. However, if it is determined within the framework of the step S390 that the difference of the first measuring value and the second measuring value is not greater than the difference of the maximum and the minimum measuring value of the present measurement arrangement, it may optionally be proceeded to the method step S410, in which a new comparison measurement arrangement is determined, if required.

In other words, within the framework of an embodiment of a method of calibrating a magnetic-field sensor, as it is shown in FIGS. 15a and 15b, as a further variant a start is made with a certain present measurement arrangement, which may, for example, be the center measurement arrangement at the position 460b (see FIG. 11). Once a minimum or maximum value of this present measurement arrangement is detected and/or reached, the comparison measurement arrangement is switched within the framework of switching to a further measurement arrangement by the multiplexer 310. Following a check measurement with this other bridge or measurement arrangement (comparison bridge or comparison measurement arrangement), once again a change back to the present measurement arrangement, i.e., for example, the center measurement arrangement, takes place until the opposite extreme is reached. At this point, it is once again switched to the other measurement arrangement.

Assuming that the successive measurements at the extreme points are made in sufficiently quick succession and that a positioning error of the present measurement arrangement or the center measurement arrangement is small with respect to the tooth distance of the indicator object, it can be assumed, in very good approximation, that the signal of the best-positioned measurement arrangement of all measurement arrangements of the plurality of measurement arrangements still provides a greater or better swing in the area of the extremes of the center measurement arrangement, so that an even better bridge or measurement arrangement can be recognized on the basis of measuring values detected on the basis of the extremes of the present measurement arrangement. In such a case, it may thus be switched to the best or even better bridge or measurement arrangement of at least two measurement arrangements, on the basis of the extremes of the present measurement arrangement.

For example, if the swing of the other bridge, however, is on the same order of magnitude or smaller, the bridge may be tested in the opposite direction in the next cycle. If there are more than three bridges, the search for the best bridge or best-positioned measurement arrangement of the plurality of measurement arrangements may be continued in the next cycle among the two bridges with the highest amplitude. This approach offers the advantage that one may work with the full sampling rate right from the beginning and switching between various measurement arrangements only has to be performed at points at which no edges occur, so that the main function of the sensor is influenced only as little as possible. The search area, however, is limited by the fact that the sensor bridge or the present measurement arrangement determined in the step S300 has to provide at least a signal quality allowing for extreme-value detection.

In order to improve the starting point with regard to the choice and/or determination of the present measurement arrangement of the previously described method, this for example could be done within the framework of a factory calibration according to an embodiment of a method of calibrating a magnetic-field sensor described in connection with FIG. 13. Alternatively or additionally, the starting point for the previously described embodiment of a method of calibrating the magnetic-field sensor 100 could also be used on the basis of the embodiment of a method described in connection with FIG. 14. A further possibility consists in using a measurement arrangement filed or stored for example in a nonvolatile memory, such as the memory 360, within the framework of the last operation of the magnetic-field sensor 100, as present measurement arrangement within the framework of the start of the above-described method. Here, the memory 360 may be used as WORM memory for permanent or fixed storage of information regarding a measurement arrangement 110.

Figure 16:
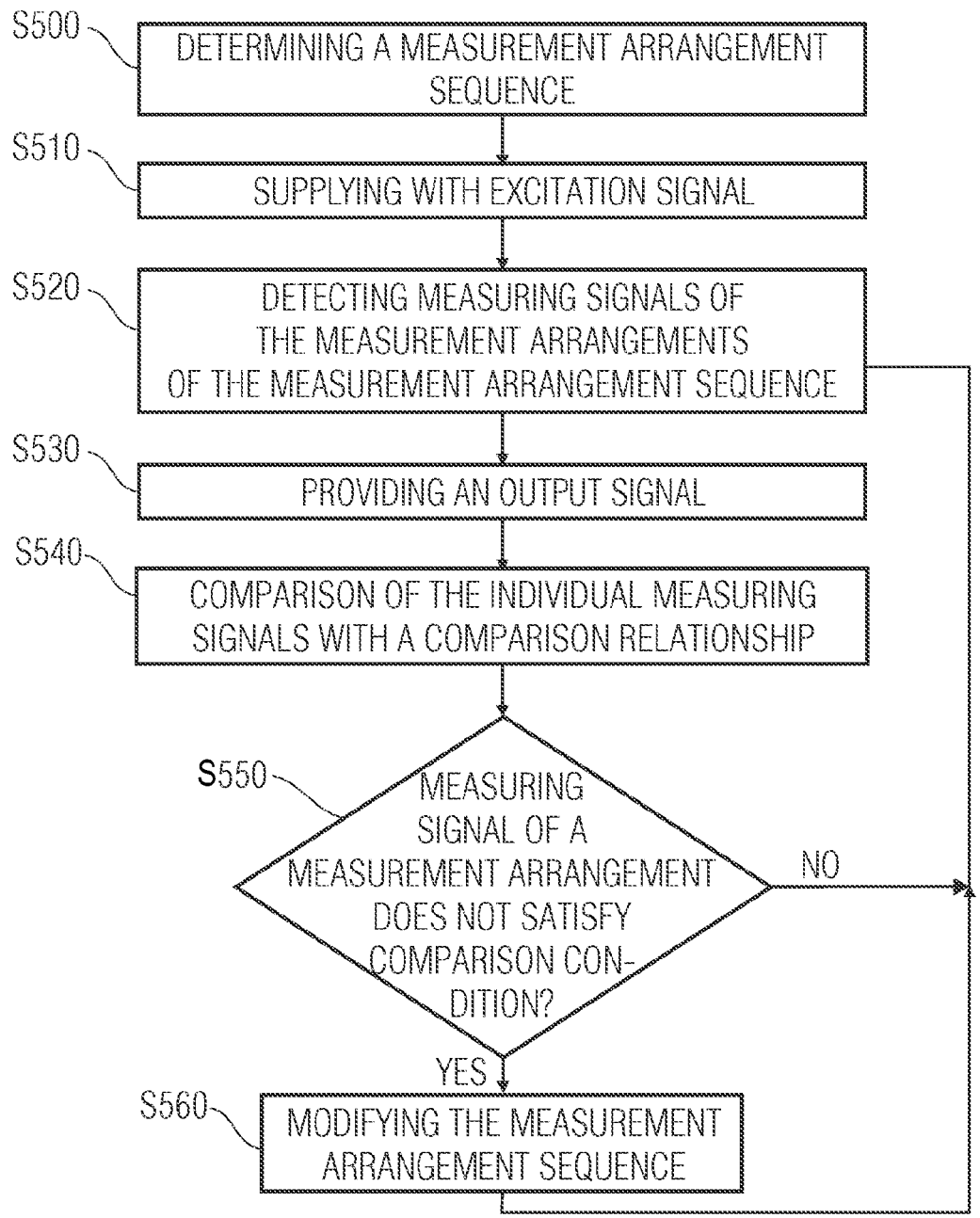
FIG. 16 shows an embodiment of a method of calibrating a magnetic-field sensor.

FIG. 16 shows a flowchart of a further embodiment of a method of calibrating a magnetic-field sensor, which comprises a plurality of sensor elements 150 connected to form measurement arrangements 110, wherein each measurement arrangement comprises a measurement tap, and wherein the magnetic-field sensor 100 is exposed to a magnetic field periodically changing (in time) at least in portions, which may, for example, be caused by a rotating or moving indicator object. Within the framework of a step S500, at first a bridge sequence including, in the simplest case, all available measurement arrangements is determined. Of course, similarly as described above, a limitation of the bridge sequence or measurement arrangement sequence may be performed by taking results of previously performed operational states of the magnetic-field sensor 100 into account. In general, a measurement arrangement sequence here thus includes a plurality of measurement arrangements or, in the case of a bridge sequence, a plurality of measurement bridges. A measurement arrangement sequence, partially also referred to as bridge sequence or configuration sequence, thus comprises information with respect to one or more measurement arrangements used within the framework of embodiments of methods of calibrating a magnetic-field sensor 100.

Within the framework of a step S510, the measurement arrangements belonging to at least the measurement arrangement sequence are supplied with the aid of an excitation signal, so that measuring signals can be tapped at the measurement taps of the measurement arrangements concerned. Within the framework of a step S520, now the measuring signals of the measurement arrangements of the measurement arrangement sequence are detected in the order of the measurement arrangement sequence, wherein the processor circuit 340 switches the multiplexer 310 corresponding to the measurement arrangement sequence through such that one or at least no more than a few measuring signals each of every measurement arrangement are generated within the framework of the step S520. Within the framework of a step S530, then an output signal is provided on the basis of the detected measuring signals of the measurement arrangement sequence based on a single through-switching of the measurement arrangement sequence and possibly output at the terminal 350 of an embodiment of a magnetic-field sensor 100. Within the framework of the step S540, the individual measuring signals of the various measurement arrangements of the measurement arrangement sequence are compared on the basis of a comparison relationship, wherein a corresponding comparison on the basis of the comparison relationship may also take past measuring signals or measuring values of the respective measurement arrangements into account, depending on the concrete implementation of an embodiment of a magnetic-field sensor 100. Depending on the concrete implementation, also a minimum/maximum recognition thus may be taken into account.

If a measuring signal of a measurement arrangement does not satisfy the comparison condition concerned, due to the comparison of the individual measuring signals with a comparison relationship, which is performed within the framework of the step S540, the measurement arrangement sequence is modified in that the measurement arrangement concerned, for example, is faded out of the measurement arrangement sequence, within the framework of a step S560. However, if all measuring signals of all measurement arrangements satisfy the comparison condition within the framework of the step S550, the method is continued with a detection of the measuring signals within the framework of the step S520.

Of course, as optional method steps, the measurement arrangement sequence may be stored after modification within the framework of the step S560, so that these are available in the case of a restart of the magnetic-field sensor and can be determined as starting measurement arrangement sequence in the framework of the step S500. Depending on the concrete implementation, this may necessitate using and/or storing the measurement arrangement sequence within the framework of a non-volatile memory.

Within the framework of the step S530, in which the output signal of the magnetic-field sensor is provided, since it is generated or produced on the basis of a number of measuring signals dependent on various measurement arrangement sequences, it is obvious to generate the output signal on the basis of an averaging of the measuring signals of the measurement arrangement sequence in order to implement a uniform signal amplitude of the magnetic-field sensor 100. Of course, it is also possible to generate a corresponding output signal on the basis of a sum signal, wherein it may be advisable, depending on the implementation, to perform a corresponding signal amplitude matching of the output signal prior to the providing at the terminal 350.

In other words, the embodiment of a method illustrated in FIG. 16 in the form of the flow chart illustrated there represents a further alternative, in which a mean value of the cyclically multiplexed measurement arrangements may be formed by means of filtering, for example. Through comparison of the individual signals or measuring signals with the mean value concerned within the framework of the comparison relationship, then one or more bridges providing bad or worse signals may be identified, so that these can be faded out of the measurement arrangement sequence or the multiplex sequence successively. For example, if a measurement arrangement provides a measuring signal with a small swing due to the fact that one or more sensor elements of the measurement arrangement concerned have gone into saturation, this measurement arrangement may be faded out or eliminated from the measurement arrangement sequence due to a corresponding comparison of the measuring value concerned, possibly taking the maximum and minimum values into consideration. In principle, defective measurement arrangements, which may for example be characterized by strong scattering of the measuring values or measuring signals, also can be identified in this way and thus be eliminated from the measurement arrangement sequence.

The method illustrated in connection with FIG. 16, in many implementations of embodiments of a magnetic-field sensor 100, offers a wide capturing range, because even in the case of taking all measurement arrangements into account within the framework of the measurement arrangement sequence, i.e., in the formation of the complete mean value, at least one good signal from the optimally placed measurement arrangement is taken into account in providing the output signal (step S530). In general, the starting amplitude is, however, greater than 1/N of the best signal, wherein N is a positive integer indicating the number of the measurement arrangements included in the measurement arrangement sequence. Moreover, embodiments of this method offer a starting behavior allowing for complete signal evaluation right from the beginning. In the case of N=3 measurement arrangements, in the case of an infinitesimal amplitude of the two other measurement arrangements as compared with the optimally placed measurement arrangement 110 of the three measurement arrangements, the overall signal at the beginning of an embodiment of a corresponding method has one third of the signal amplitude as output amplitude, even if all measurement arrangements are part of the measurement arrangement sequence.

Of course, within the framework of various embodiments of methods of calibrating a magnetic-field sensor 100 and within the framework of corresponding embodiments of magnetic-field sensors 100, the most diverse implementations regarding numbers of sensor elements, measurement arrangements and their geometric arrangement can be realized. Even though, at some points within the framework of the present description, a distance of 2.5 mm with respect to the distance of the sensor elements of a measurement arrangement has been described, this of course is meant just as little limiting as the number of the measurement bridges, sensor elements or other structures of 11, 33 or 3, as these were mentioned exemplarily before. Embodiments of a magnetic-field sensor 100, as well as embodiments of a method of calibrating a magnetic-field sensor 100 thus allow for self-adjustment of a sensor in a magnetic circuit, which may, for example, be employed within the framework of an incremental speed measurement in the automobile sector. Here, corresponding indicator objects, which lead to a periodic modulation of a magnetic field to which an embodiment of a magnetic-field sensor 100 is exposed, may be connected by rotating objects, such as shafts, wheels and other objects. Correspondingly, embodiments of magnetic-field sensors 100 may, however, also be used for detection 100 of a magnetic field periodically changed by an indicator object and performing linear movement.

In many embodiments of magnetic-field sensors or sensor arrangements, these have sensor elements or magnetic sensors laterally shifted with respect to each other in the layout, which may, for example, be xMR sensor elements. After the assembly of the magnet with respect to the sensor package, then a sub-group of the sensors or sensor elements may be selected permanently, for example, that sub-group of sensor elements having the most favorable location with respect to the back-bias magnet. In this context, favorable may, for example, mean that they have a smallest magnetic offset, i.e., for example, a lowest average measuring value with respect to the measuring signals concerned.

Moreover, the above-described methods of calibration and/or the results arising therefrom can also be implemented and used within the framework of an error recognition functionality of the sensor concerned. Since, in many cases of application, there is no necessity of changing the optimum sensor element or the optimum measurement arrangement during the life of the sensor, the conclusion that the respective sensor or a component in its surrounding has an error may for example be drawn from a change of the respective location, so that an attached system may output a corresponding error message. In the case of a rotational-speed sensor of a wheel within the framework of an ABS system, the accompanying ABS control device may indicate a defect of the overall system to the driver due to a change of the location of the optimum sensor elements, for example.

Depending on the conditions, embodiments of the inventive methods may be implemented in hardware or in software. The implementation may be on a digital storage medium, for example a floppy disk, CD or DVD, with electronically readable control signals capable of cooperating with a programmable computer system or processor system so that an embodiment of a method according to the invention is executed. In general, an embodiment of the present invention thus also consists in a software program product and/or a computer program product and/or a program product with program code stored on a machine-readable carrier for performing an embodiment of a method according to the invention, when the software program product is executed on a computer or processor. In other words, the invention may thus be realized as a computer program and/or software program and/or program with a program code for performing an embodiment of a method, when the program is executed on a processor. Here, the processor may be formed by a computer, a CPU (central processing unit), a chip card (smart card), an application-specific integrated circuit (ASIC), or another integrated circuit (IC).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A method of calibrating a magnetic-field sensor comprising a plurality of magnetoresistive sensor elements selectable for forming different measurement arrangements, each measurement arrangement comprising a measurement tap, wherein the sensor elements are arranged in a laterally offset manner on a chip of the magnetic-field sensor, and wherein the magnetic-field sensor is exposed to a magnetic field periodically changing at least in portions, the method comprising:
supplying the measurement arrangements with an excitation signal, to generate a tappable measuring signal at each measurement tap of the measurement arrangements;
detecting the measuring signals of at least two measurement arrangements over at least one period of the magnetic field;
evaluating the detected measuring signals by determining the respective maximum and minimum measuring values of the detected measuring signals; and
determining the measurement arrangement with the greatest difference of the respective maximum and minimum measuring values and selecting the measurement arrangement with the greatest difference for all subsequent measurement operations until a further calibration is performed.

2. The method according to claim 1, further comprising moving an indicator object, wherein moving the indicator object leads to the magnetic field changing periodically at least in portions at the magnetic-field sensor.

3. The method according to claim 1, wherein detecting the measuring signals of at least two measurement arrangements over at least one period of the magnetic field comprises detecting a plurality of measuring signals of a first measurement arrangement of the two measurement arrangements over at least one period of the magnetic field, switching to a second measurement arrangement of the at least two measurement arrangements, and detecting a plurality of measuring signals of the second measurement arrangement over at least one period of the magnetic field.

4. The method according to claim 1, wherein detecting the measuring signals of at least two measurement arrangements over at least one period of the temporally changing magnetic field comprises multiple execution of switching to a first measurement arrangement of the at least two measurement arrangements;
detecting a measuring signal of the first measurement arrangement;
switching to a second measurement arrangement of the at least two measurement arrangements; and
detecting a measuring signal of the second measurement arrangement over at least one period of the magnetic field changing at least in portions.

5. The method according to claim 1, further comprising storing information regarding the determined measurement arrangement in a memory of the magnetic-field sensor.

6. The method according to claim 1, wherein detecting the measuring signals comprises detecting the measuring signals with respect to a reference signal of a reference tap of a reference arrangement, wherein the reference arrangement comprises a resistive element.

7. A magnetic-field sensor comprising:
a plurality of magnetoresistive sensor elements selectable for forming different measurement arrangements, each measurement arrangement comprising a measurement tap, wherein the sensor elements are arranged in a laterally offset manner on a chip of the magnetic-field sensor, and
a control circuit coupled to the measurement taps of the measurement arrangements;
wherein the control circuit is formed to supply the measurement arrangements with an excitation signal to generate a tappable measuring signal at each measurement tap of the measurement arrangements, further formed to detect measuring signals of at least two measurement arrangements over at least one period of a magnetic field periodically changing at least in portions, further formed to evaluate the detected measuring signals by determining the respective maximum and minimum measuring values of the detected measuring signals, and formed to determine the measurement arrangement with the greatest difference of the respective maximum and minimum measuring values and to select the measurement arrangement with the greatest difference for all subsequent measurement operations until a further calibration is performed.

8. The magnetic-field sensor according to claim 7, wherein the measurement arrangements each comprise at least one sensor element.

9. The magnetic-field sensor according to claim 7, wherein a common sensor element belongs to two different measurement arrangements.

10. The magnetic-field sensor according to claim 7, wherein the measurement arrangements comprise a series connection of two sensor elements with a measurement tap connected between the two sensor elements.

11. The magnetic-field sensor according to claim 7, wherein the measurement arrangements comprise a parallel connection of two series connections, wherein at least one of the two series connections comprises at least one sensor element.

12. The magnetic-field sensor according to claim 7, wherein the sensor elements are arranged on a chip of the magnetic-field sensor in a manner shifted laterally with respect to each other.

13. The magnetic-field sensor according to claim 7, wherein the sensor elements are magnetoresistive sensor elements.

14. The magnetic-field sensor according to claim 7, wherein the control circuit comprises a multiplexer coupled to the measurement taps of the measurement arrangements, and wherein the multiplexer is formed to couple one of the measurement taps to an output of the multiplexer in response to a control signal.

15. The magnetic-field sensor according to claim 14, wherein an analog/digital converter is coupled to the output of the multiplexer, so that the analog/digital converter can be coupled to a center tap of the measurement arrangements each.

16. The magnetic-field sensor according to claim 7, wherein the control circuit comprises an analog/digital converter which can be coupled to at least one center tap of a measurement arrangement.

17. The magnetic-field sensor according to claim 7, wherein the control circuit further comprises a pre-processing circuit formed to filter detected measuring signals.

18. The magnetic-field sensor according to claim 7, wherein the control circuit further comprises a processor circuit formed to provide an output signal, based on at least one of the detected measuring signals.

19. The magnetic-field sensor according to claim 7, wherein the control circuit further comprises a supply circuit coupled to the measurement arrangements via a first terminal and a second terminal of the measurement arrangements and formed to impress an excitation signal on the measurement arrangements.

20. The magnetic-field sensor according to claim 7, wherein the control circuit further comprises a reference measurement arrangement with a reference tap, and wherein the reference measurement arrangement comprises a resistive element.

21. The magnetic-field sensor according to claim 7, wherein the control circuit further comprises a memory allowing for non-volatile storage or one-time storage of information.

22. A non-transitory storage medium with a program recorded thereon, the program with a program code for performing, when the program is executed on a processor, a method of calibrating a magnetic-field sensor comprising a plurality of magnetoresistive sensor elements selectable for forming different measurement arrangements, each measurement arrangement comprising a measurement tap, wherein the sensor elements are arranged in a laterally offset manner on a chip of the magnetic-field sensor, and wherein the magnetic-field sensor is exposed to a magnetic field periodically changing at least in portions, the method comprising supplying the measurement arrangements with an excitation signal, to generate a tappable measuring signal at each measurement tap of the measurement arrangement, detecting the measuring signals of at least two measurement arrangements over at least one period of the magnetic field, evaluating the detected measuring signals by determining the respective maximum and minimum measuring values of the detected measuring signals, and determining the measurement arrangement with the greatest difference of the respective maximum and minimum measuring values and selecting the measurement arrangement with the greatest difference for all subsequent measurement operations until a further calibration is performed.

23. A method of calibrating a magnetic-field sensor comprising a plurality of magnetoresistive sensor elements selectable for forming different measurement arrangements, each measurement arrangement comprising a measurement tap, wherein the sensor elements are arranged in a laterally offset manner on a chip of the magnetic-field sensor, wherein the magnetic-field sensor is exposed to a magnetic field periodically changing at least in portions, and wherein a common sensor element belongs to two different measurement arrangements, the method comprising:
 supplying the measurement arrangements with an excitation signal, to generate a tappable measuring signal at each measurement tap of the measurement arrangements;
 detecting the measuring signals of at least two measurement arrangements over at least one period of the magnetic field;
 evaluating the detected measuring signals by determining the respective maximum and minimum measuring values of the detected measuring signals; and
 determining the measurement arrangement with the greatest difference of the respective maximum and minimum measuring values and selecting the measurement arrangement with the greatest difference for a measurement operation.

24. A magnetic-field sensor comprising:
 a plurality of magnetoresistive sensor elements selectable for forming different measurement arrangements, each measurement arrangement comprising a measurement tap, wherein the sensor elements are arranged in a laterally offset manner on a chip of the magnetic-field sensor, and
 a control circuit coupled to the measurement taps of the measurement arrangements;
 wherein the control circuit is formed to supply the measurement arrangements with an excitation signal to generate a tappable measuring signal at each measurement tap of the measurement arrangements, further formed to detect measuring signals of at least two measurement arrangements over at least one period of a magnetic field periodically changing at least in portions, further formed to evaluate the detected measuring signals by determining the respective maximum and minimum measuring values of the detected measuring signals, and formed to determine the measurement arrangement with the greatest difference of the respective maximum and minimum measuring values and to select the measurement arrangement with the greatest difference for all subsequent measurement operations a measurement operation;
 wherein a common sensor element belongs to two different measurement arrangements.

25. A non-transitory storage medium with a program recorded thereon, the program with a program code for performing, when the program is executed on a processor, a method of calibrating a magnetic-field sensor comprising a plurality of magnetoresistive sensor elements selectable for forming different measurement arrangements, each measurement arrangement comprising a measurement tap, wherein the sensor elements are arranged in a laterally offset manner on a chip of the magnetic-field sensor, wherein the magnetic-field sensor is exposed to a magnetic field periodically changing at least in portions, and wherein a common sensor element belongs to two different measurement arrangements, the method comprising supplying the measurement arrangements with an excitation signal, to generate a tappable measuring signal at each measurement tap of the measurement arrangement, detecting the measuring signals of at least two measurement arrangements over at least one period of the magnetic field, evaluating the detected measuring signals by determining the respective maximum and minimum measuring values of the detected measuring signals, and determining the measurement arrangement with the greatest difference of the respective maximum and minimum measuring values and selecting the measurement arrangement with the greatest difference for a measurement operation.

26. A method of calibrating a magnetic-field sensor comprising a plurality of magnetoresistive sensor elements selectable for forming different measurement arrangements, each measurement arrangement comprising a measurement tap, wherein the sensor elements are arranged in a laterally offset manner on a chip of the magnetic-field sensor, wherein the magnetic-field sensor is exposed to a magnetic field periodically changing at least in portions, and wherein the measurements arrangements are formed into bridge with a common power supply, the method comprising:
supplying the measurement arrangements with an excitation signal, to generate a tappable measuring signal at each measurement tap of the measurement arrangements;
detecting the measuring signals of at least two measurement arrangements over at least one period of the magnetic field;
evaluating the detected measuring signals by determining the respective maximum and minimum measuring values of the detected measuring signals; and
determining the measurement arrangement with the greatest difference of the respective maximum and minimum measuring values and selecting the measurement arrangement with the greatest difference for a measurement operation.

27. A magnetic-field sensor comprising:
a plurality of magnetoresistive sensor elements selectable for forming different measurement arrangements, each measurement arrangement comprising a measurement tap, wherein the sensor elements are arranged in a laterally offset manner on a chip of the magnetic-field sensor, and
a control circuit coupled to the measurement taps of the measurement arrangements;
wherein the control circuit is formed to supply the measurement arrangements with an excitation signal to generate a tappable measuring signal at each measurement tap of the measurement arrangements, further formed to detect measuring signals of at least two measurement arrangements over at least one period of a magnetic field periodically changing at least in portions, further formed to evaluate the detected measuring signals by determining the respective maximum and minimum measuring values of the detected measuring signals, and formed to determine the measurement arrangement with the greatest difference of the respective maximum and minimum measuring values and to select the measurement arrangement with the greatest difference for all subsequent measurement operations a measurement operation;
wherein the measurements arrangements are formed into bridge with a common power supply.

28. A non-transitory storage medium with a program recorded thereon, the program with a program code for performing, when the program is executed on a processor, a method of calibrating a magnetic-field sensor comprising a plurality of magnetoresistive sensor elements selectable for forming different measurement arrangements, each measurement arrangement comprising a measurement tap, wherein the sensor elements are arranged in a laterally offset manner on a chip of the magnetic-field sensor, wherein the magnetic-field sensor is exposed to a magnetic field periodically changing at least in portions, and wherein the measurements arrangements are formed into bridge with a common power supply, the method comprising supplying the measurement arrangements with an excitation signal, to generate a tappable measuring signal at each measurement tap of the measurement arrangement, detecting the measuring signals of at least two measurement arrangements over at least one period of the magnetic field, evaluating the detected measuring signals by determining the respective maximum and minimum measuring values of the detected measuring signals, and determining the measurement arrangement with the greatest difference of the respective maximum and minimum measuring values and selecting the measurement arrangement with the greatest difference for a measurement operation.

* * * * *